(12) United States Patent
Immer et al.

(10) Patent No.: US 12,355,138 B1
(45) Date of Patent: Jul. 8, 2025

(54) UNDERGROUND TELEMETRY DEVICE

(71) Applicant: Earth Scout, GBC, Minneapolis, MN (US)

(72) Inventors: Michael Immer, Minneapolis, MN (US); Troy Schmidtke, Minneapolis, MN (US); Dipesh Karki, Minneapolis, MN (US); Jerry Thompson, Minneapolis, MN (US)

(73) Assignee: EarthScout LLC, Brooklyn Park, MN (US)

( * ) Notice: Subject to any disclaimer, the term of this patent is extended or adjusted under 35 U.S.C. 154(b) by 0 days.

(21) Appl. No.: 18/401,471

(22) Filed: Dec. 30, 2023

Related U.S. Application Data

(63) Continuation of application No. 17/699,344, filed on Mar. 21, 2022, now Pat. No. 11,862,843.

(51) Int. Cl.
  *H01Q 1/24* (2006.01)
  *H04W 4/38* (2018.01)
  *H05K 5/02* (2006.01)
  *H05K 5/03* (2006.01)

(52) U.S. Cl.
  CPC .............. *H01Q 1/241* (2013.01); *H04W 4/38* (2018.02); *H05K 5/0204* (2013.01); *H05K 5/03* (2013.01)

(58) Field of Classification Search
  CPC .......... H01Q 1/24; H01Q 1/241; H01Q 1/244; H01Q 1/3233; H05K 5/0273; H05K 5/0204; H05K 5/03; H04W 4/38
  See application file for complete search history.

(56) References Cited

U.S. PATENT DOCUMENTS

| | | |
|---|---|---|
| 4,998,826 A | 3/1991 | Wood et al. |
| 5,049,896 A | 9/1991 | Conley |
| 6,216,795 B1 | 4/2001 | Buchl |
| 6,525,276 B1 | 2/2003 | Vellidus et al. |
| 6,986,294 B2 | 1/2006 | Fromme et al. |
| 7,080,816 B1 | 7/2006 | Vaccaro |
| 7,617,992 B2 | 11/2009 | Ivans |
| 7,852,271 B2 | 12/2010 | Grunig et al. |
| 7,896,299 B2 | 3/2011 | Chinuki et al. |
| 7,932,451 B2 | 4/2011 | Workman et al. |
| 8,262,517 B2 | 9/2012 | Balasubramanyan |
| 8,698,695 B2 * | 4/2014 | Wyckoff ................ H01Q 1/085 343/890 |
| 9,000,988 B2 | 4/2015 | McGuire |
| 9,107,354 B2 | 8/2015 | Martin et al. |
| 9,146,370 B2 | 9/2015 | Inoue et al. |
| 9,244,192 B2 | 1/2016 | Cullen et al. |
| 9,320,356 B2 | 4/2016 | Ralstin |
| 9,374,950 B2 | 6/2016 | Upadhyaha et al. |
| 9,490,525 B2 | 11/2016 | Harmelink et al. |
| 9,581,342 B2 | 2/2017 | Daniels et al. |
| 9,657,926 B2 | 5/2017 | Steele |
| 9,675,146 B1 | 6/2017 | Howell |
| 9,732,902 B2 | 8/2017 | Schutz et al. |

(Continued)

*Primary Examiner* — Thai Pham
(74) *Attorney, Agent, or Firm* — Dietz Law Office LLC

(57) ABSTRACT

A containment housing contains environment probes and a data transmit module below grade of a field. A breakaway antenna assembly couples to the data module and transmits data from the sensors real time. The breakaway antenna includes a 360-degree hinge and is self-righting, thereby allowing farm implements to move past the antenna without breaking antenna.

18 Claims, 25 Drawing Sheets

(56) References Cited

U.S. PATENT DOCUMENTS

| | | | |
|---|---|---|---|
| 9,804,097 B1 | 10/2017 | Tang et al. | |
| 9,894,852 B2* | 2/2018 | Gilbert | H04L 67/125 |
| 10,134,312 B2 | 11/2018 | Guinn et al. | |
| 10,386,296 B1 | 8/2019 | Wolf | |
| 10,492,361 B2 | 12/2019 | Schildroth et al. | |
| 11,237,045 B1* | 2/2022 | Karki | G01J 1/4204 |
| 2010/0029268 A1* | 2/2010 | Myer | F21S 2/00 |
| | | | 340/521 |
| 2021/0021913 A1* | 1/2021 | Peterson | H04B 13/02 |
| 2021/0204496 A1 | 7/2021 | Andrade et al. | |
| 2022/0180724 A1* | 6/2022 | Avery | G08B 21/20 |

\* cited by examiner

UNDERGROUND TELEMETRY DEVICE

CROSS-REFERENCE TO RELATED APPLICATIONS

This application claims the filing benefit and priority of U.S. Non-Provisional patent application Ser. No. 17/699,344 filed Mar. 21, 2022 the contents of which are incorporated herein by reference in their entireties.

FEDERAL SPONSORSHIP

Not Applicable

JOINT RESEARCH AGREEMENT

Not Applicable

TECHNICAL FIELD

This invention pertains generally to agriculture field sensor units. More particularly, the invention pertains to a sensor mount that is positioned underground, allowing the sensors to remain in the field even when agricultural implements work the field. The sensors may be installed into the root zone of a crop without disturbing the soil in the root zone. Further, the sensors can be removed and interchanged without damaging wires or disturbing soil within the plant growth zone. The underground telemetry device of the present invention includes a breakaway antenna assembly that transmits data from field sensor units to a remote unit or base station. The breakaway antenna of the present invention further allows a user to work the field without necessarily requiring removal of the antenna.

BACKGROUND

Over the years various systems have been implemented to monitor crop growth and field conditions. Various crop monitoring practices have required stationary soil sensors positioned in the field. However, over the life cycle of the crop, these sensors need to be removed, to avoid risk of damage, dislocation, or loss, each time the field is worked. Further, in the past, the sensors were not placed until after planting occurs. Placement of sensors or probes has required digging soil in the root zone, disturbing or damaging the plant growth. Also, at times it is desirable to interchange or remove a sensor before harvest, however, in the past, removal or interchange of a sensor or probe has disturbed the soil and root zone of the growing crop. Additionally, in the past, there has been a potential for damaging the sensor or probe wires when removing the sensor or probe from the field. It is desirable to provide a device that allows the installation or interchange of sensors and probes into the root zone any time during the growth cycle without disturbing plant growth soil. Also, it is desirable to provide a device that provides the ability to remove the sensor or probe without damaging wires and without disturbing plant growth soil.

Further, as the crop begins to grow the height of the crop canopy may interfere with transmission of the desired sensor data. An antenna may be coupled to the sensor, however, an antenna extending significantly above the ground further necessitates the need to remove the antenna and sensors when working the field to avoid contact with the agricultural implements. By way of example, as an irrigation system rolls across a field, any antennas or sensors in the path of the irrigation equipment will get knocked over, dislocated, or worse. It is desirable to provide a device that allows agriculture field sensor units to remain in the field when working the field. It is further desirable to provide a device capable of transmitting data from the field sensors regardless the height of the crop, wherein the device may remain in the field even when the field is worked.

SUMMARY

Embodiments according to aspects of the invention are capable of both containing and providing efficient access to an environmental sensor and data logger positioned below grade. Once the containment housing is installed underground, the sensors may be accessed, installed, removed or interchanged without disturbing the root zone of the adjacent plant growth. Also, during the off season the antenna wires may be stored in the underground containment housing to reduce a likelihood of damage to the wires. According to other aspects, the apparatus of the invention is capable of remaining in the field even when certain agricultural functions are performed such as irrigation, discing, or no-till planting. Further, the invention utilizes an antenna assembly that automatically tilts and folds over as a farming implement pushes past the antenna. After the implement passes over the antenna, the antenna assembly springs back to an upright position. Further, in accordance with aspects of the invention the farm implement may make initial contact with the antenna assembly from any direction.

These and other embodiments according to aspects of the invention include an apparatus having a containment housing, an antenna assembly, a remote data logger or remote data transmit module, and an environment sensor. The containment housing keeps dirt from piling up around a remote data transmit module and environment sensor contained within the housing below grade. The containment housing has sidewalls and an open top, wherein the containment housing is adapted for placement in the ground below grade. A cover supported by the containment housing at the open top of the containment housing includes a secondary lid that provides access to the interior of the housing while minimizing the amount of dirt caving into the interior of the housing. The antenna assembly has a breakaway base, pole sections coupled to the breakaway base, and an active element or omni-directional antenna capable of transmitting and receiving signals. The antenna may be selected to communicate with RF base stations, cellular towers, wifi routers or other known wireless transmission. The active element antenna is coupled to a free end of the pole sections. The remote data transmit module contained within the containment housing is adapted to electrically couple to the active element of the antenna assembly. Slots are formed in the sidewall of the containment housing that allows a portion of the environment sensor to penetrate into the surrounding soil at various desired depths, while at least a portion of the environment sensor is contained with the containment housing.

According to aspects of the invention, the environment sensor may be a temperature probe, moisture probe, soil salinity probe, soil alkalinity probe or other probe to measure various aspects of the soil. Those skilled in the art will appreciate that these probes may be of a wireless type that transmits signals to the remote data transmit module or more be hard wired to the remote data transmit module. In accordance with certain aspects the invention may further include a plurality of slots formed in the sidewalls of the containment housing wherein the slots are adapted for receiving a portion of the environment sensor therethrough.

Further, whisker markers may be fixed to a portion of the cover or lid and extend upward. The length of the whisker may be varied that a desired length of whisker extends out of the soil above grade. The whisker markers assist the user in pinpointing the access opening of the containment housing. Brackets may be fixed to an interior of the sidewalls and as such are adapted for supporting the remote data transmit module. The breakaway base may include a pole support portion and base support portion, wherein the pole support portion hinges about the base support portion in any of 360 degrees. The breakaway base may further include a tension member coupled to both the pole support portion and the base support portion of the breakaway base.

Other embodiments according to aspects of the invention include an apparatus for containing a remote data transmit module below grade capable of transmitting signals associated with data logged from a sensor. The apparatus includes a containment housing having a cover, a telemetry device and at least a portion of an environment sensor contained within the containment housing. The containment housing has sidewalls and an open top, wherein the containment housing is adapted for placement in the ground below grade. The cover is supported by the containment housing at the open top of the containment housing. The telemetry device includes an antenna assembly and a remote data transmit module. The antenna assembly has a breakaway base, pole sections coupled to the breakaway base, and an active element coupled to a free end of the pole sections. The breakaway base includes a pole support portion and base support portion, wherein the pole support portion hinges about the base support portion in any of 360 degrees. The remote data transmit module is contained within the containment housing and is adapted to electrically couple to the active element of the antenna assembly.

Further according to aspects of the invention the containment housing includes a plurality of slots formed in the sidewalls of the containment housing wherein the slots are adapted for receiving a portion of the environment sensor therethrough. A marking device such as a survey wire marker or whisker marker may be coupled to a secondary lid of the cover and extend upward above grade to help facilitate access to the underground containment housing. Within the containment housing brackets may be fixed to an interior of the sidewalls such that the brackets are adapted for supporting the remote data transmit module. The antenna assembly and breakaway base further includes a tension member that couples to both the pole support portion and the base support portion of the breakaway base. The tension member applies a force to upright the antenna assembly when the antenna is tilted of folded towards the ground.

There are many advantages to having access to real time data about soil conditions in a field used to produce a variety of crops. By way of example, knowing the real time values of temperature and moisture in the root zone of a growing crop assists the user in determining the right time and amount of irrigation to apply to a field. Previously sensors had to be removed from the field to avoid damage, destruction or loss when performing various field operations such as irrigating, discing, cultivating or planting. The present invention allows a user to dig a hole deep enough for the containment housing to be buried below grade such that irrigation, discing and planting may be performed without removing the housing. The sensors and remote data transmit module are safely contained within the housing.

Further, farm implements may pass above the housing without damaging the housing or the sensors and module contained therein. The antenna assembly is coupled to the housing and the antenna's active element is electrically coupled to the transmit module. The antenna allows the data from the sensor to be transmitted wirelessly to a remote receiver or base station. Further, the breakaway base of the antenna assembly of the present invention allows a farm implement to push the antenna over as the implement drives through the field past the antenna. The tension member of the breakaway base returns the antenna to an upright position after the implement has past the antenna. At times the user may choose to remove the antenna assembly before working the field or during the off season. The antenna coaxial cable may be placed into the containment housing and a cap may be used to cover the opening for the base pole of the antenna assembly to keep the soil out of the containment housing. Whisker markers attached to the cover of the containment housing help the user identify the exact location of the containment housing to thereby efficiently re-engage the antenna assembly to the housing. A GPS module within the remote data transmit module may further assist the user to pinpoint the location of the containment housing.

The accompanying drawings, which are incorporated in and constitute a portion of this specification, illustrate embodiments of the invention and, together with the detailed description, serve to further explain the invention. The embodiments illustrated herein are presently preferred; however, it should be understood, that the invention is not limited to the precise arrangements and instrumentalities shown. For a fuller understanding of the nature and advantages of the invention, reference should be made to the detailed description in conjunction with the accompanying drawings.

DESCRIPTION OF THE DRAWINGS

In the Various Figures, which are not Necessarily Drawn to Scale, Like Numerals Throughout the Figures Identify Substantially Similar Components.

DETAILED DESCRIPTION

The following description provides detail of various embodiments of the invention, one or more examples of which are set forth below. Each of these embodiments are provided by way of explanation of the invention, and not intended to be a limitation of the invention. Further, those skilled in the art will appreciate that various modifications and variations may be made in the present invention without departing from the scope or spirit of the invention. By way of example, those skilled in the art will recognize that features illustrated or described as part of one embodiment, may be used in another embodiment to yield a still further embodiment. Thus, it is intended that the present invention also cover such modifications and variations that come within the scope of the appended claims and their equivalents.

The underground sensor mount and telemetry device 10 of the present invention is particularly well suited for remote transmission of field condition data or information to a remote collecting unit or base station. The user installs the containment housing, preferably in an open row between the crop growth soil of adjacent rows of crop. This allows probes or sensors to penetrate into the crop's root zone without disturbing the crop growth soil. This advantage is particularly useful for strip till operations because the containment housing and sensors of the present invention won't interfere with the till strips. Although environment sensors or probes 90 are positioned underground a breakaway antenna assembly 100 of the present invention elevates the active element 190 of the antenna above the crop canopy. The antenna assembly includes pole sections that may be added or removed to vary the overall height of the antenna assembly. Depending upon the crop being grown, the desirable height of the antenna's active element may be varied. The underground sensor mount and telemetry device 10 of the present invention is particularly well suited to maintain selected sensors in the field and transmitting real-time data even when the field is being worked. Also, the underground sensor mount and telemetry device provides a stable location for the sensor, thereby reducing the need for continuous maintenance. With reference to the Figures, various embodiments according to aspects of the invention will be described in greater detail.

Figure 1:
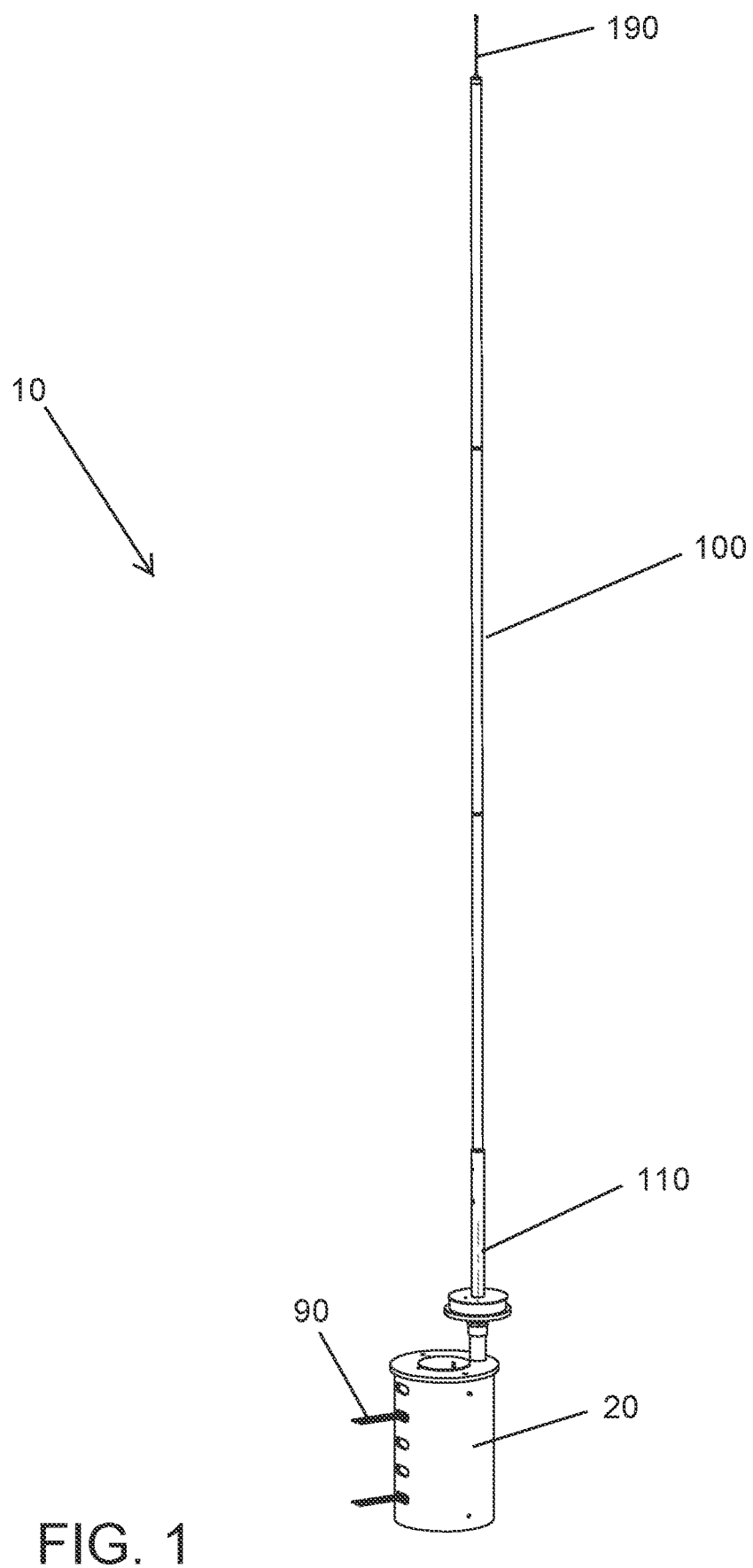
FIG. 1 is a front perspective view of an underground sensor mount and telemetry device of the present invention shown with an antenna assembly in an upright position.
Figure 2:
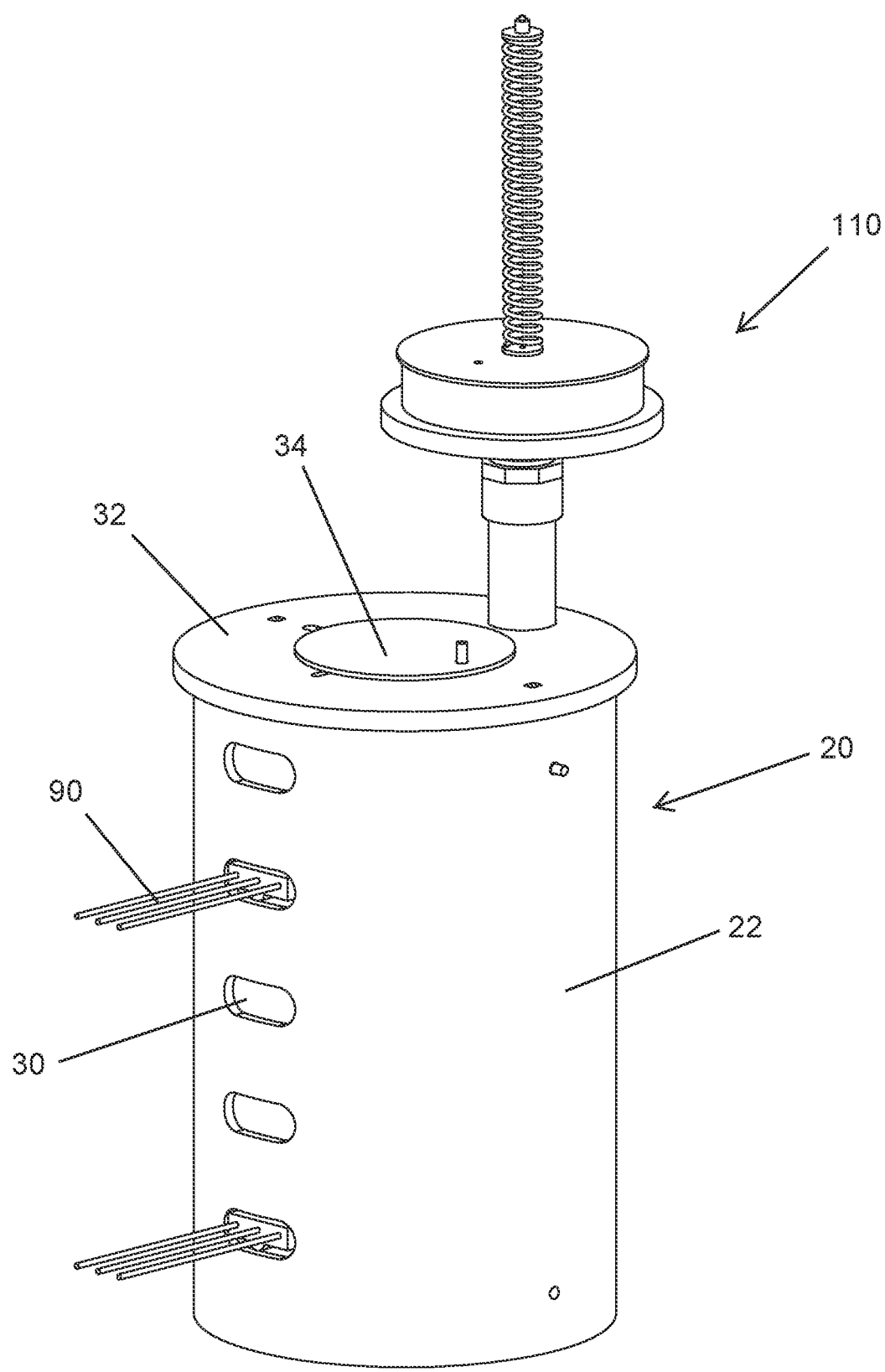
FIG. 2 is a partial sectioned perspective view of a containment housing and breakaway base of the present invention.
Figure 3:
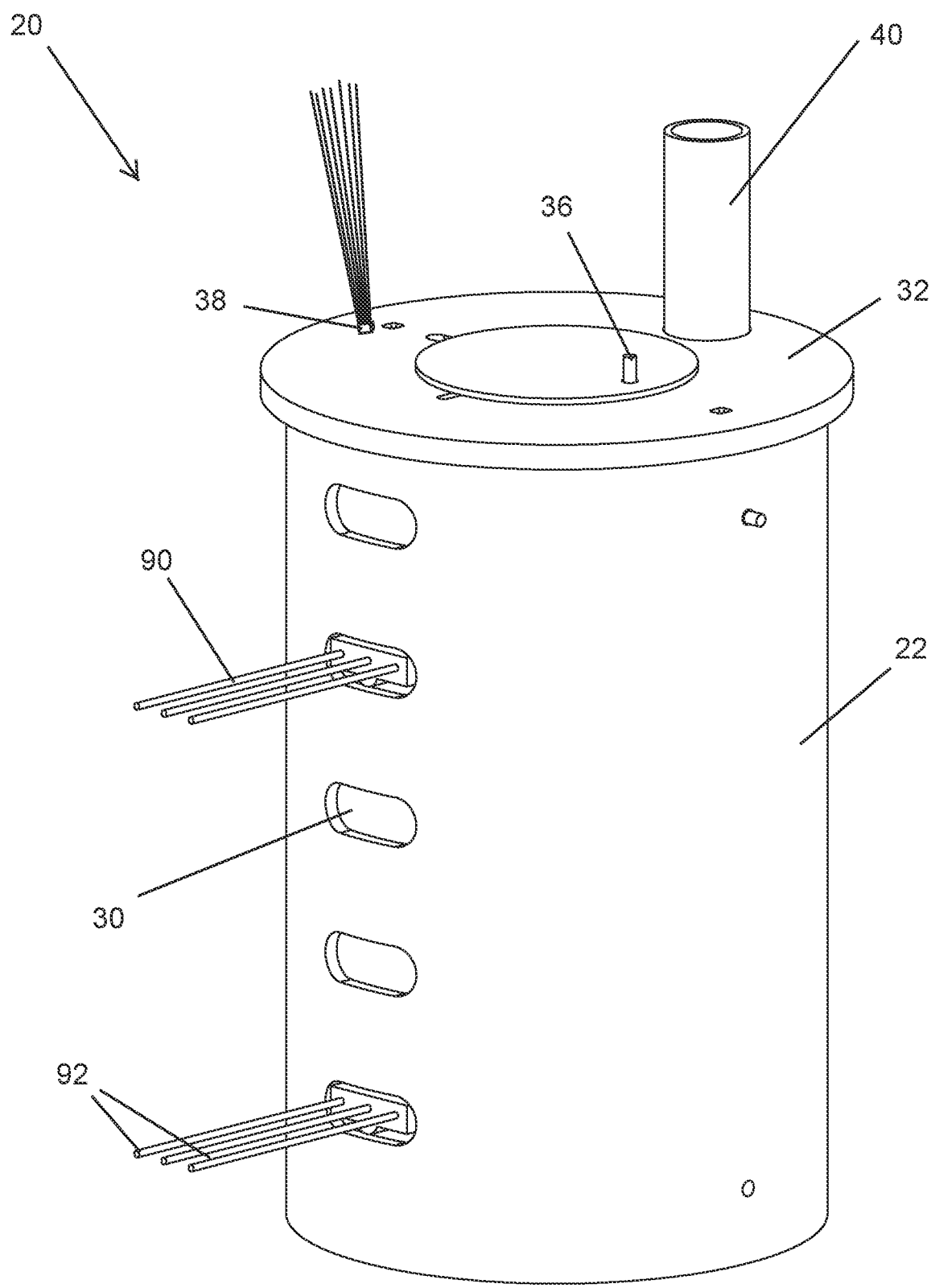
FIG. 3 is a perspective view of a containment housing of the present invention.

With reference to FIGS. 1-3, an underground sensor mount and telemetry device 10 is shown having the antenna assembly 100 coupled to the containment housing in an upright position (FIG. 1). The underground sensor mount and telemetry device 10 generally includes a containment housing 20, environment sensors 90, and antenna assembly 100. The containment housing 20 may be constructed of varying diameters, heights, shapes and materials dependent upon the particular needs and environment into which the housing will be placed. The antenna assembly generally includes a breakaway base 110, pole sections and an active element or RF omni-directional transmit/receive antenna 190. The containment housing 20 includes sidewalls 22 and open top and bottom ends 24. Cover 32 rests on top of the open top end of the containment housing 20. Cover 32 includes a secondary access lid 34 that allows a user to access the interior of the containment housing without disturbing as much soil by removing the entire cover. Probes or prongs 92 of the environment sensor 90 extend through slots 30 formed in the sidewall 22 of the containment housing 20. The series of slots 30 allow for multiple sensors 90 and the height of the sensors within the soil may be varied. Of course, more than one series of slots may be formed into the hosing to thereby allow penetration of the probe into the soil in various directions.

The breakaway base 110 couples to base pole 40 extending upward out of cover 32 and containment housing 20. When the base pole is removed a cap or plug (not shown) may cover the hole for the base pole. Lid retainer 36 engages secondary lid 34 to maintain the position and orientation of the lid with respect to the cover. Whisker marker 38 may be engaged to the cover 32, secondary lid 34 or base pole 40. The base pole 40 extends a sufficient amount above the cover 32 such that soil may be placed over the cover to bury the housing. The top of the base pole may be aligned level or slightly above ground level. The whiskers 38 are of sufficient length to extend through the soil and above ground level to mark the location of the buried containment housing. Of course, other location markers of known suitable construction may replace or be utilized in conjunction with the whisker markers without departing from the scope of the present invention.

The remote data transmit module 50 of the underground sensor mount and telemetry device 10 includes a battery power supply that requires re-charging or replacement approximately every three hundred days. Alternatively, a solar panel of known suitable construction may be coupled to the remote data transmit module to provide power to the telemetry device. The wireless aspect of the invention may include RF, wi-fi, z-wave, cellular, Bluetooth or other wireless systems capable of transmitting and receiving data and commands. Operating system apps may also be utilized to create additional functionality for the module. However, some units may be used to simply log and transmit data from the environment sensors 90.

Figure 4:
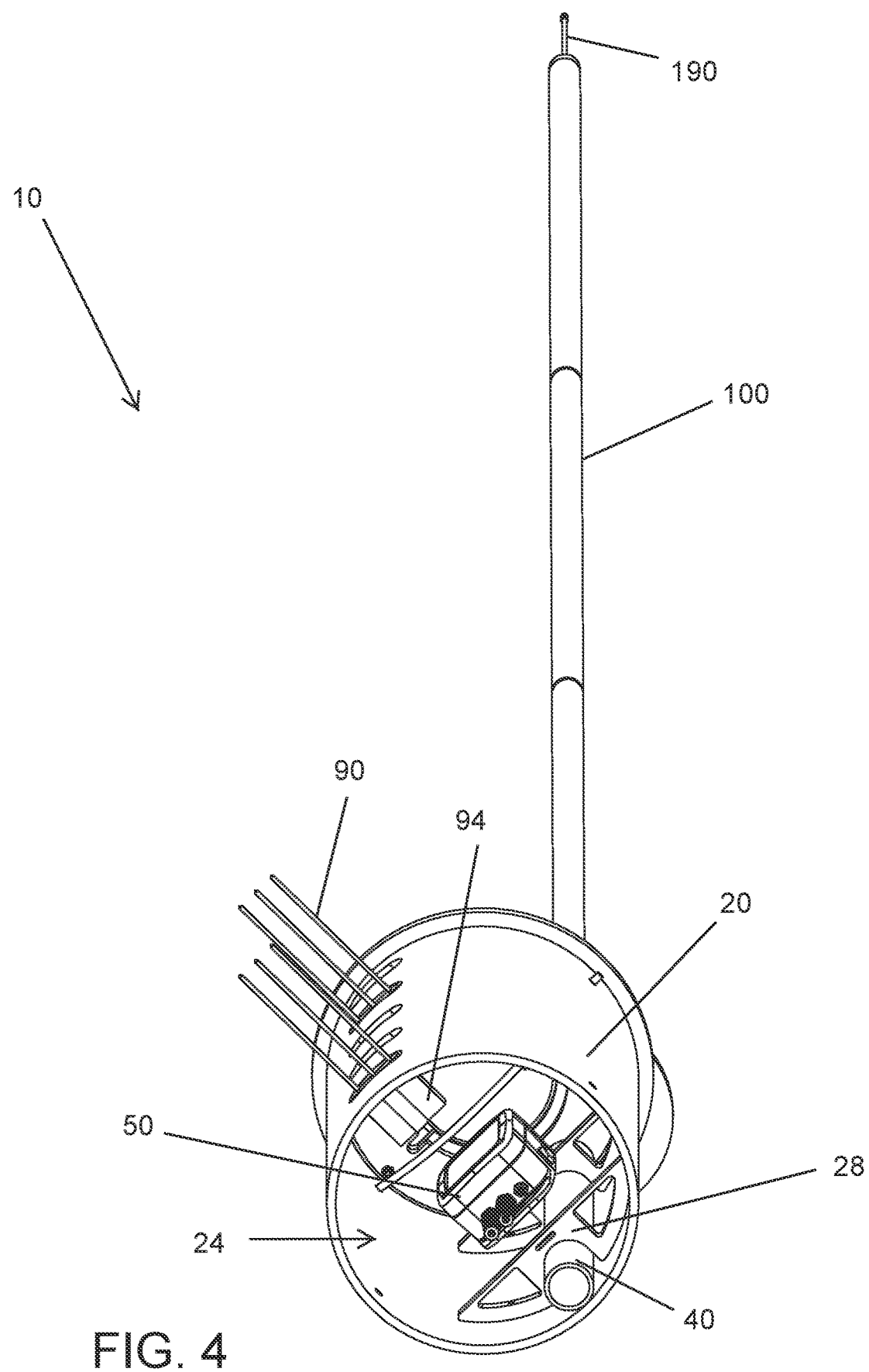
FIG. 4 is a bottom perspective view of an underground sensor mount and telemetry device of the present invention shown with an antenna assembly in a tilted position.
Figure 5:
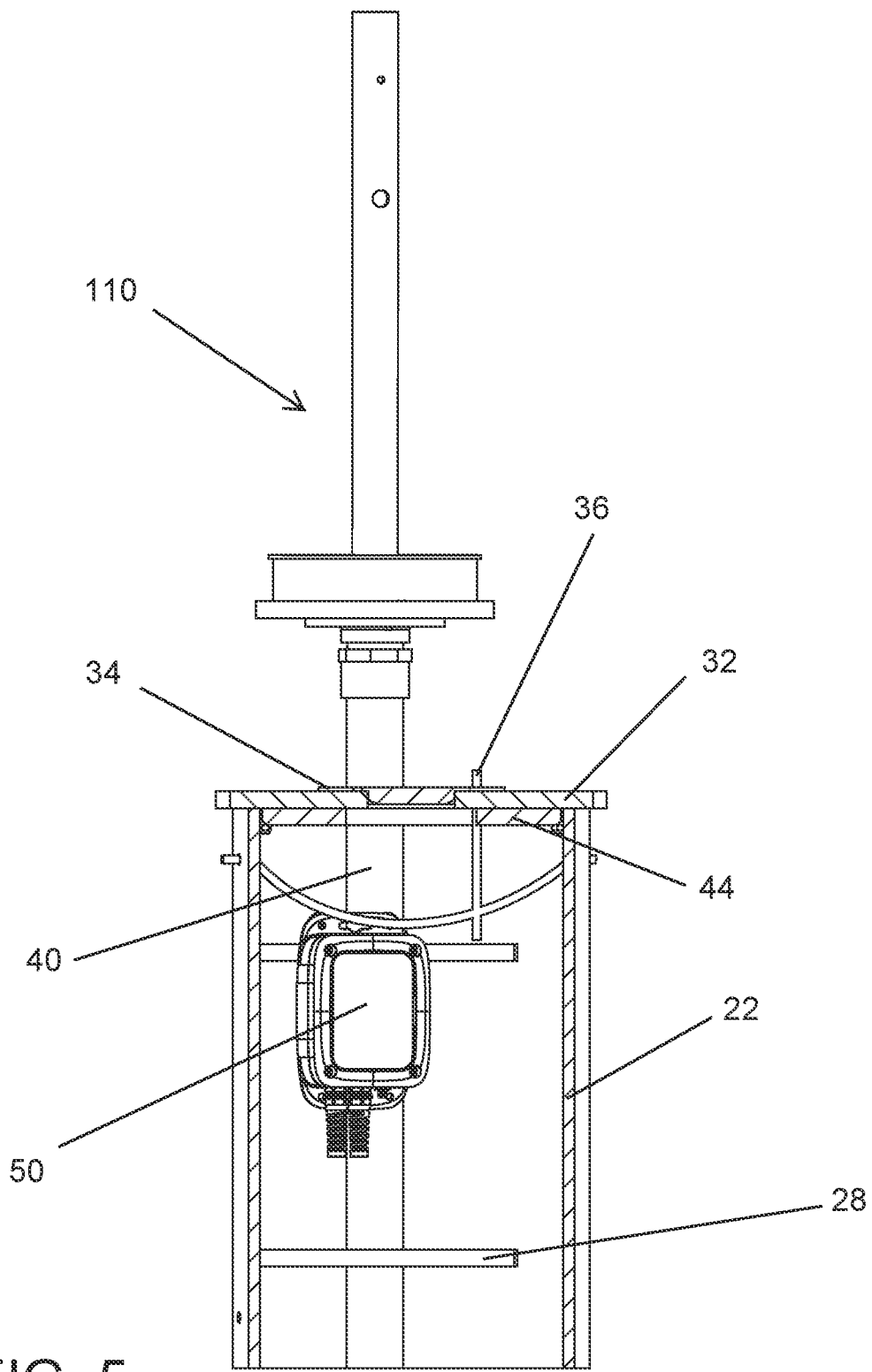
FIG. 5 is a partial sectioned perspective view of a containment housing and breakaway base of the present invention.
Figure 6:
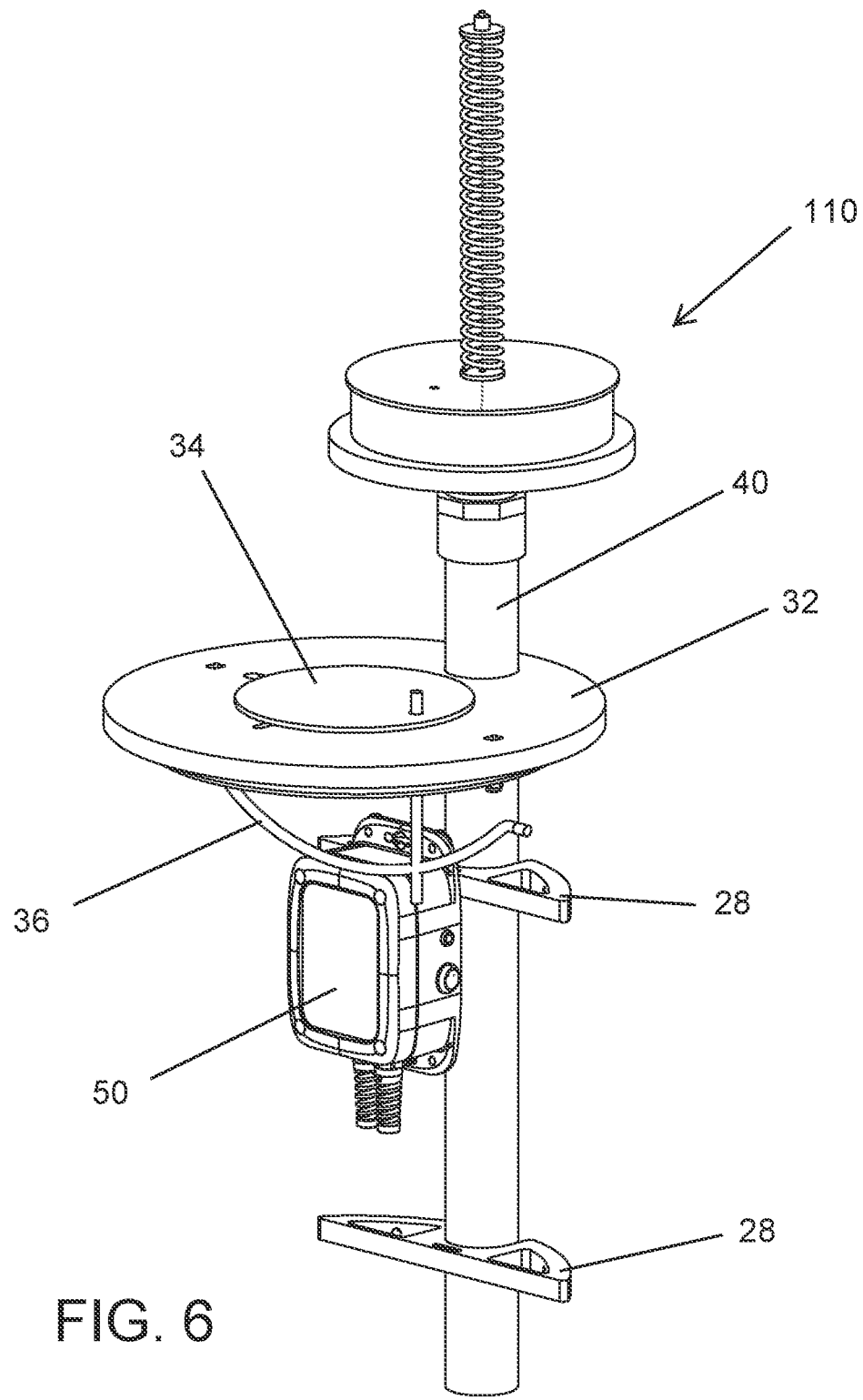
FIG. 6 is a perspective view of a portion of the containment housing and breakaway base of the present invention.

With reference now to FIGS. 4-6 the housing interior and orientation of components contained within the housing 20 are further illustrated. The containment housing 20 encloses environment sensor 90, base pole 40 and remote data transmit module 50 therein. The bottom of cover 32 includes a rim or hub 44 that extends down into the interior of the containment housing. The rim 44 holds the cover 32 in place and restricts the cover from sliding off the top of the housing 20. The environment sensor 90 may be a wireless unit having a sending unit 94 contained within the housing 20 and prongs 92 extending through slots 30 and into the soil. The remote sending unit 50 is secured to an inner sidewall of the housing via bracket or pole strap 28. The unit 50 may be hung, fastened or otherwise secured to the bracket 28. The bracket 28 is fixed to the housing and includes a cutout sized to receive the base pole 30 between the bracket and the inner sidewall of the housing 20. The base pole 40 is of sufficient length to pass through the cutouts such that one end of the pole embeds firmly in the soil under the containment housing bottom opening 24 while the other end extends out of a hole formed in the cover 32. In this manner the base pole 40 provides a firm anchor for the breakaway base 110 and the antenna assembly 100 in general.

Figure 7:
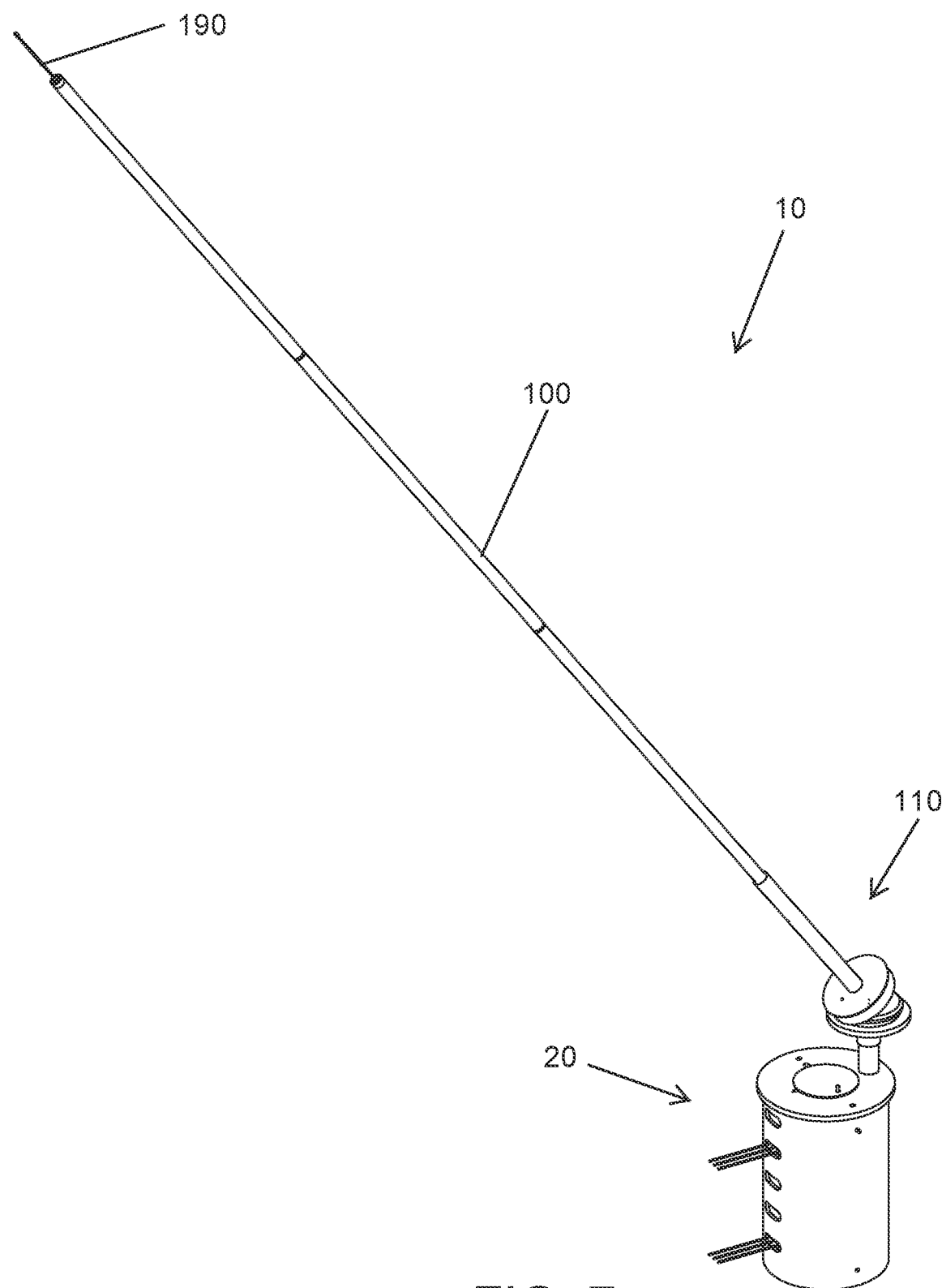
FIG. 7 is a perspective view of an underground sensor mount and telemetry device of the present invention shown with an antenna assembly in a tilted position.
Figure 8:
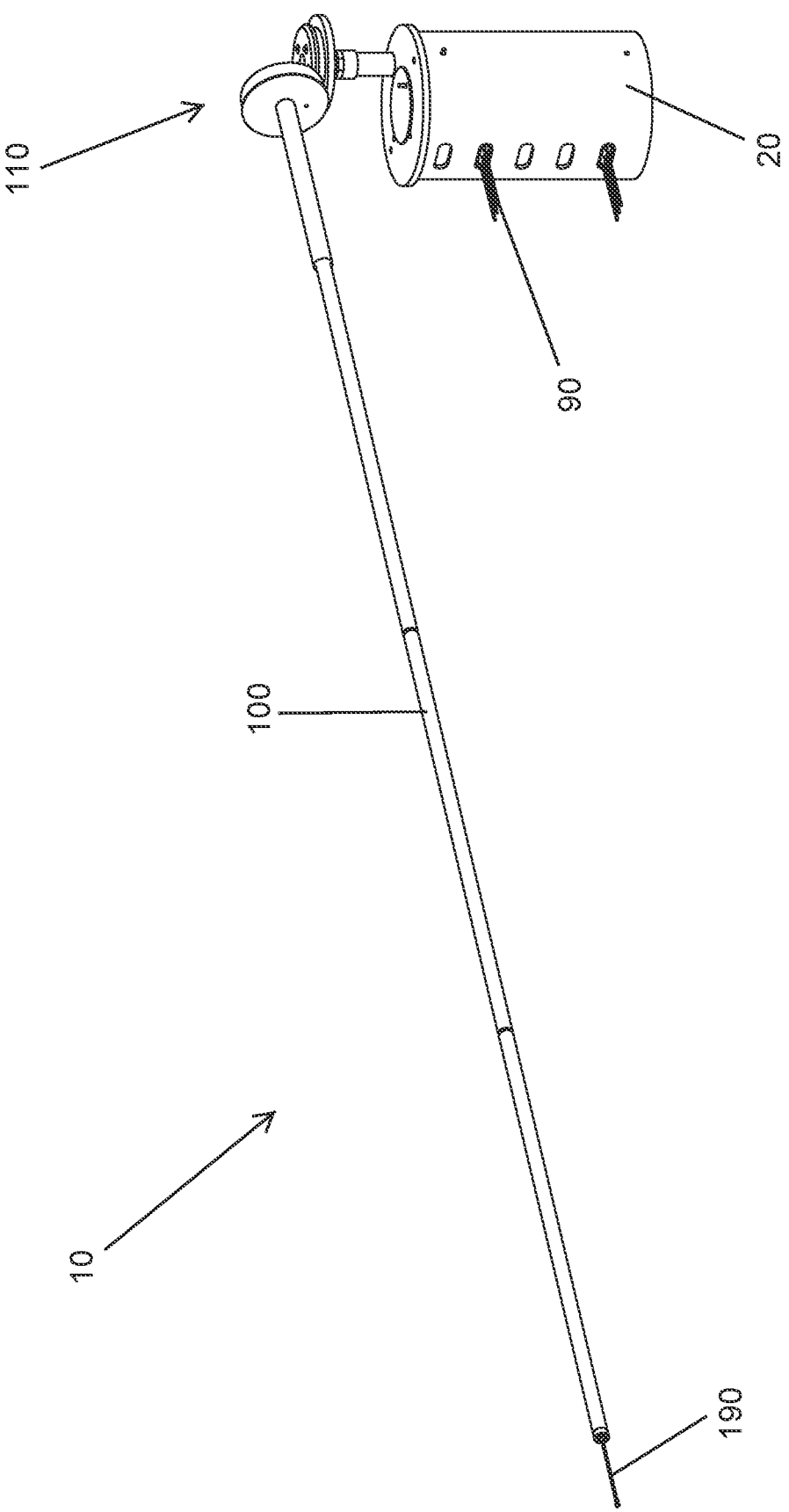
FIG. 8 is a perspective view of an underground sensor mount and telemetry device of the present invention shown with an antenna assembly in a folded position.
Figure 9:
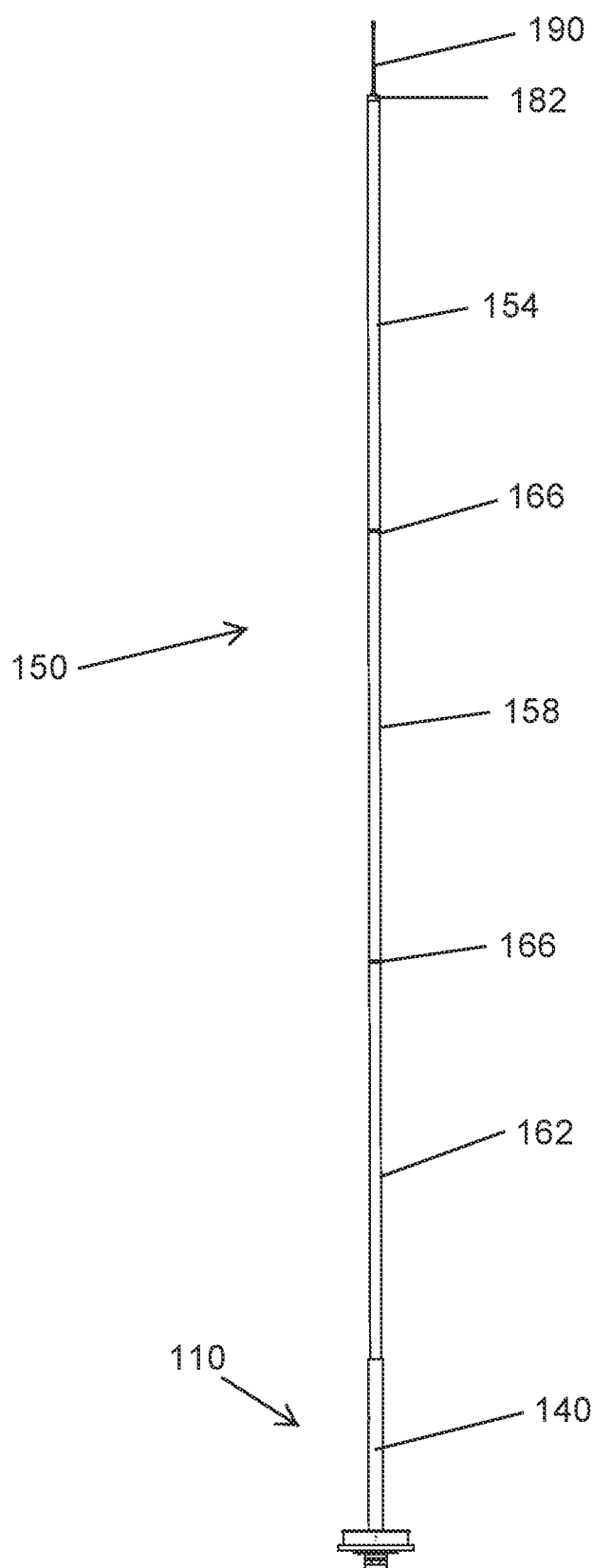
FIG. 9 is a perspective view of an antenna assembly of the present invention shown in an upright position.
Figure 10:
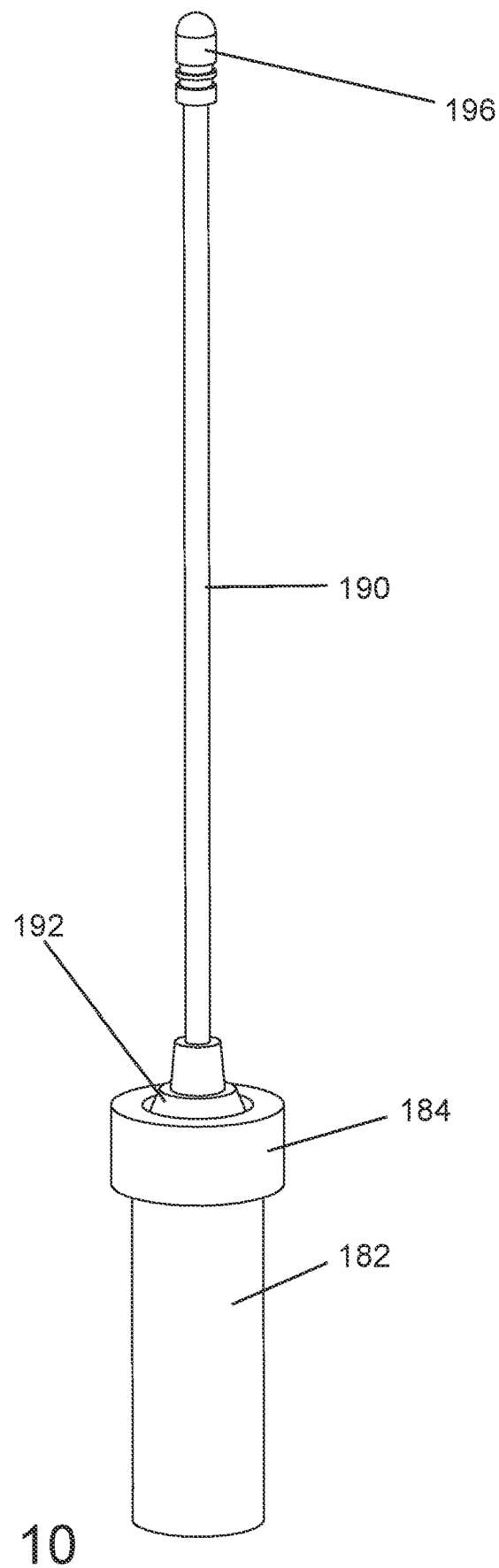
FIG. 10 is a perspective view an omni-directional antenna and pole cap of the present invention.
Figure 11:
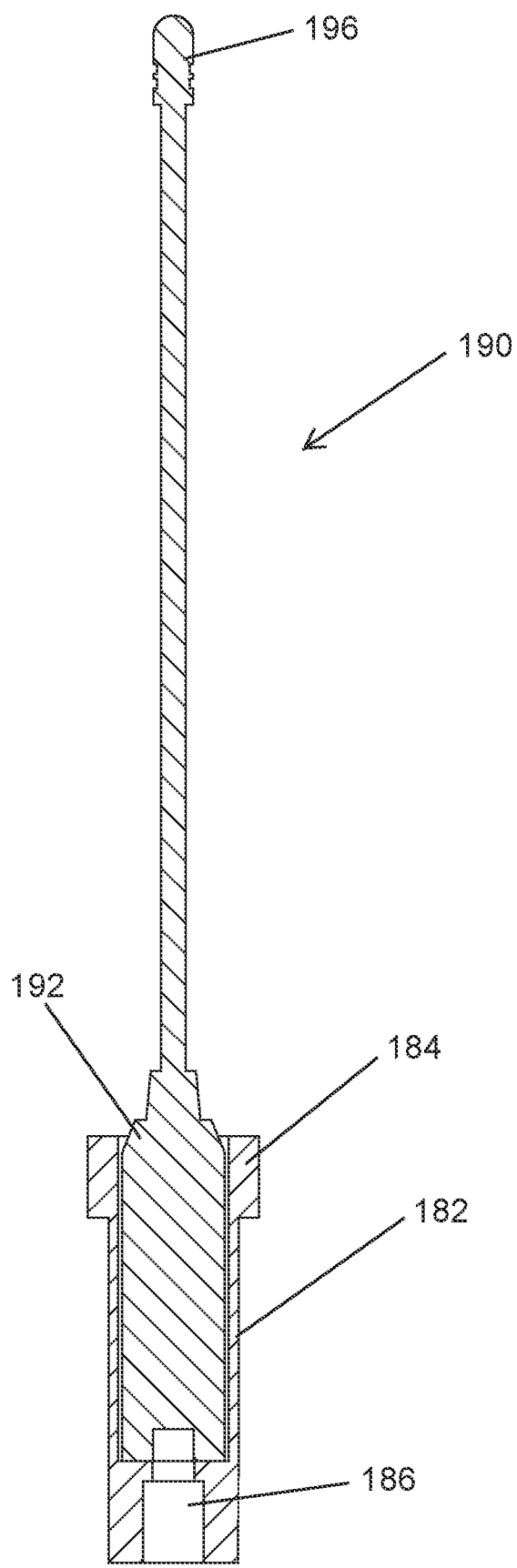
FIG. 11 is a partial sectioned perspective view an omni-directional antenna and pole cap of the present invention.
Figure 12:
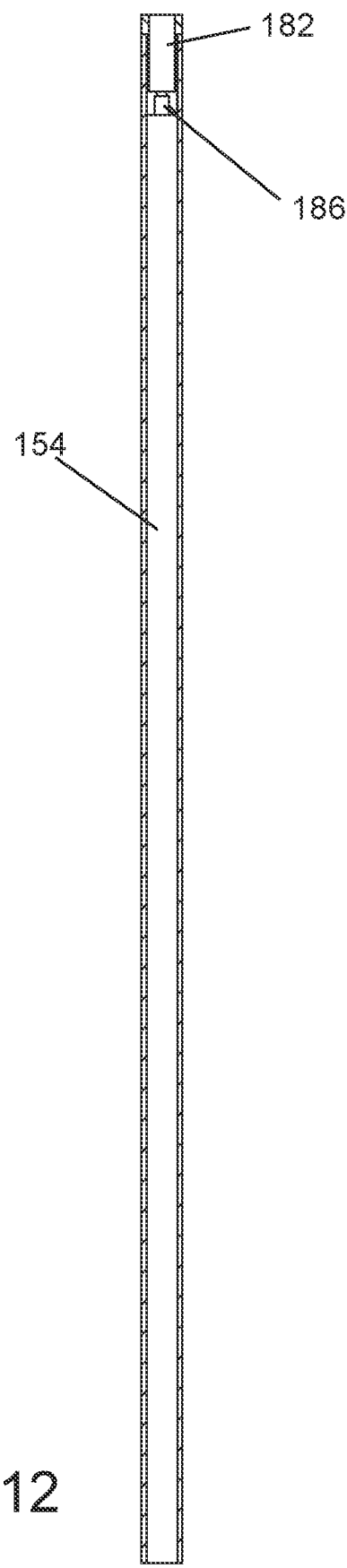
FIG. 12 is a partial sectioned perspective view of a top antenna extension section of an antenna assembly of the present invention.
Figure 13:
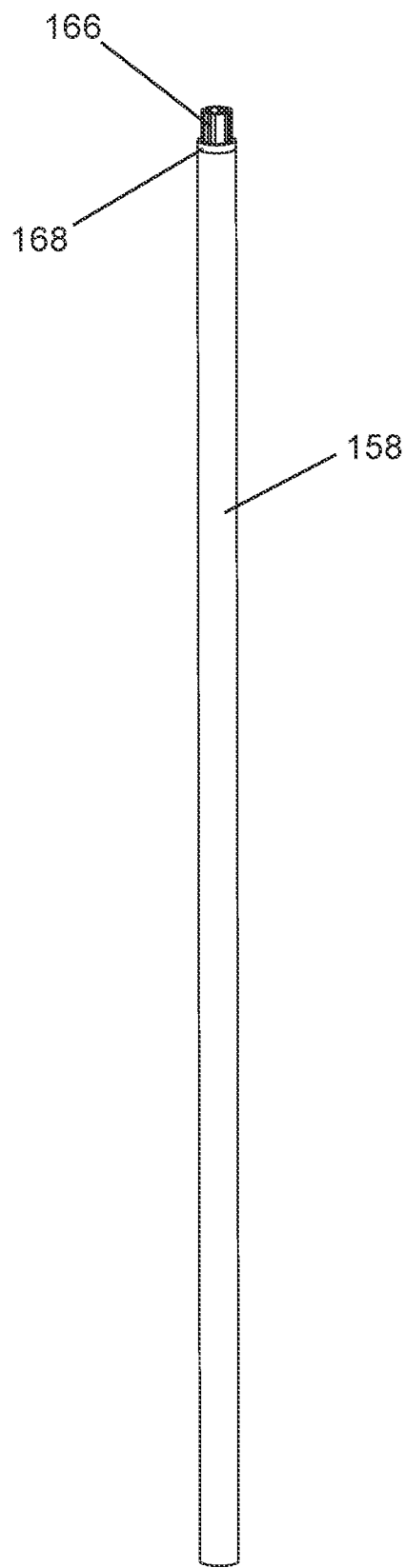
FIG. 13 is a perspective view of a mid-antenna extension section of an antenna assembly of the present invention.
Figure 14:
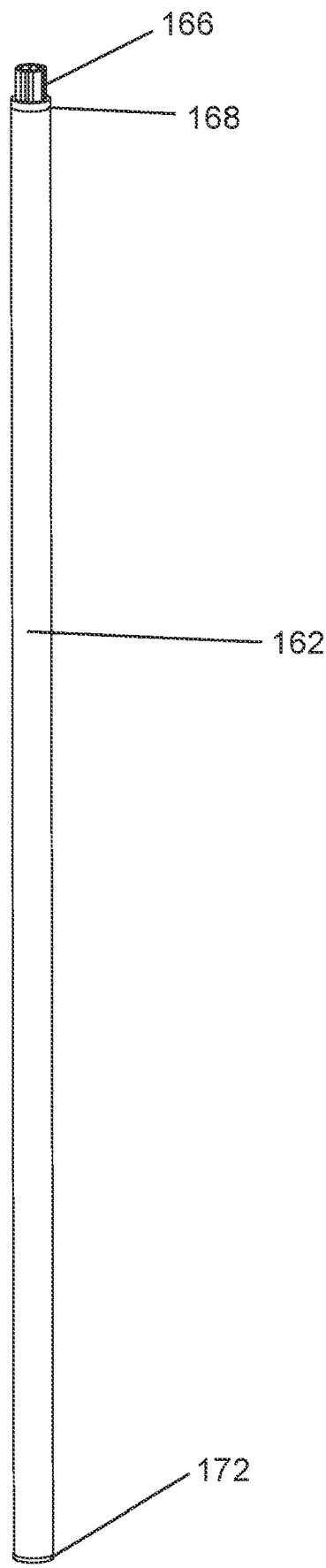
FIG. 14 is a perspective view of a base antenna section of an antenna assembly of the present invention.
Figure 15:
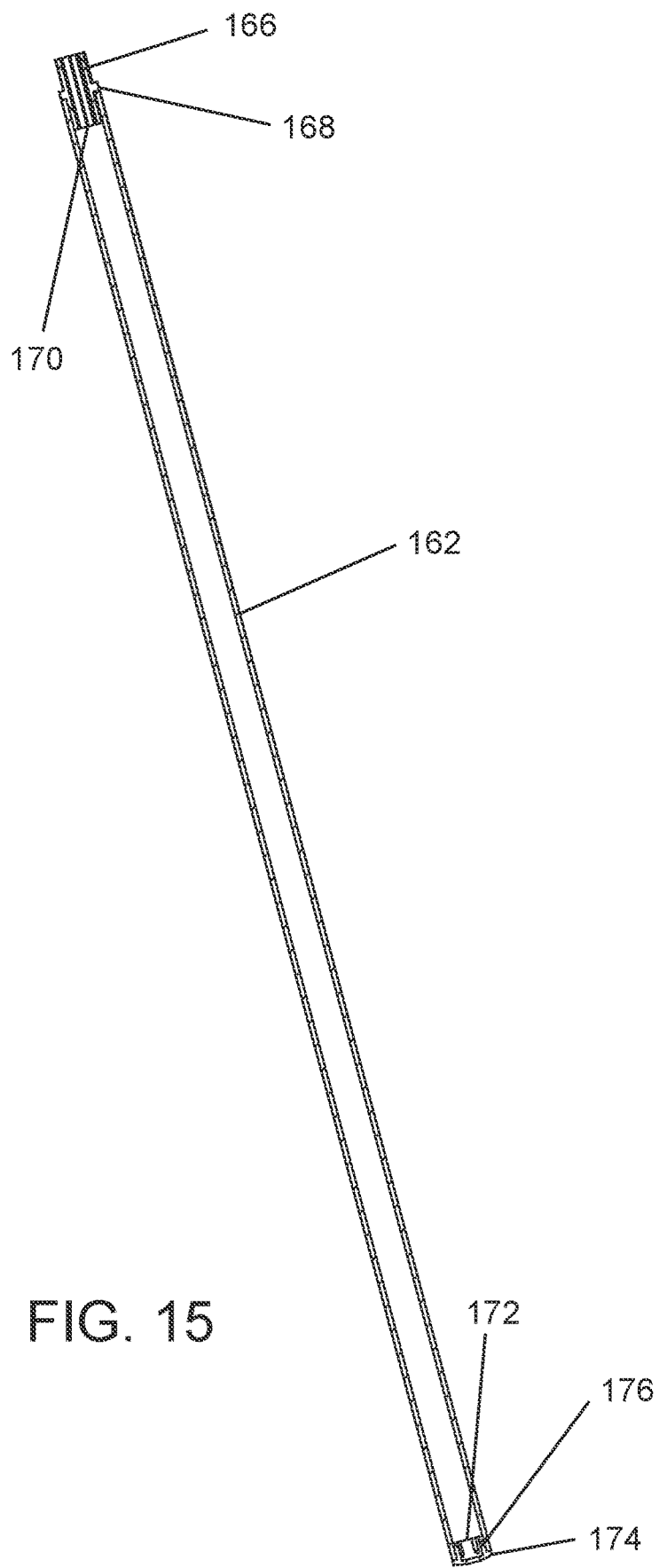
FIG. 15 is a partial sectioned perspective view of a base antenna section of the type shown in FIG. 14.
Figure 16:
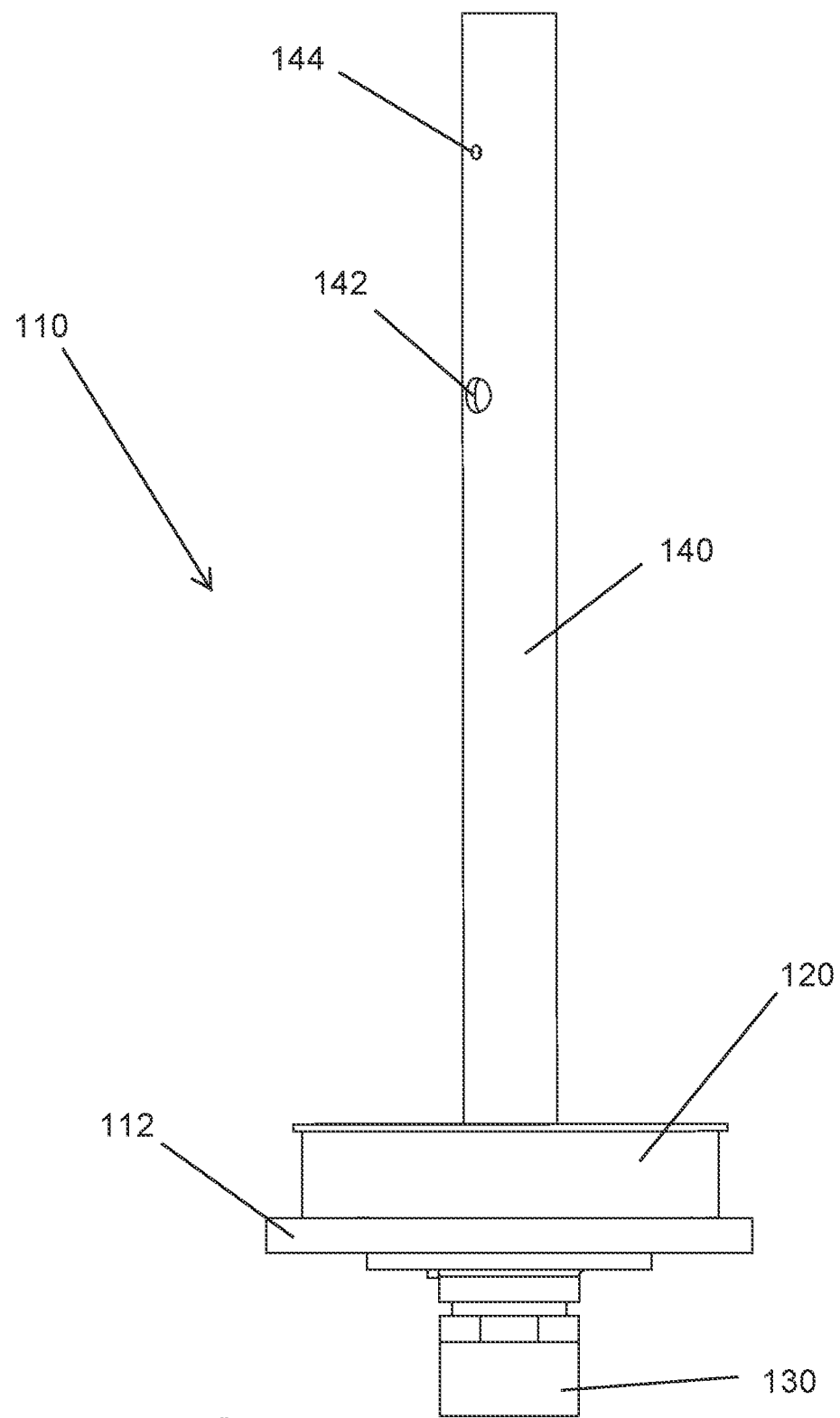
FIG. 16 is a side view of the breakaway base of the present invention.
Figure 17:
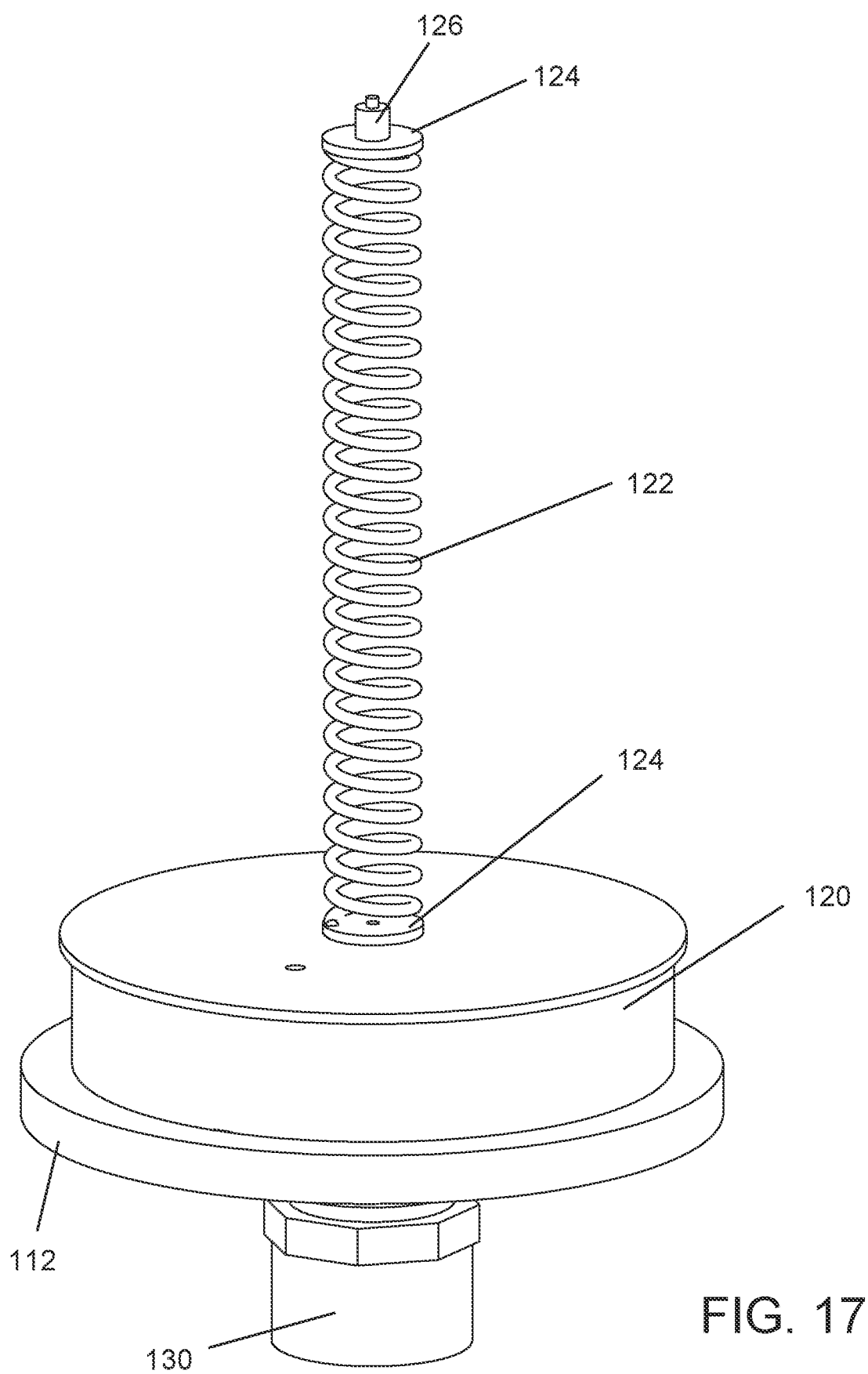
FIG. 17 is a perspective view of the breakaway base of the present invention shown having the breakaway tension spring tube removed.
Figure 18:
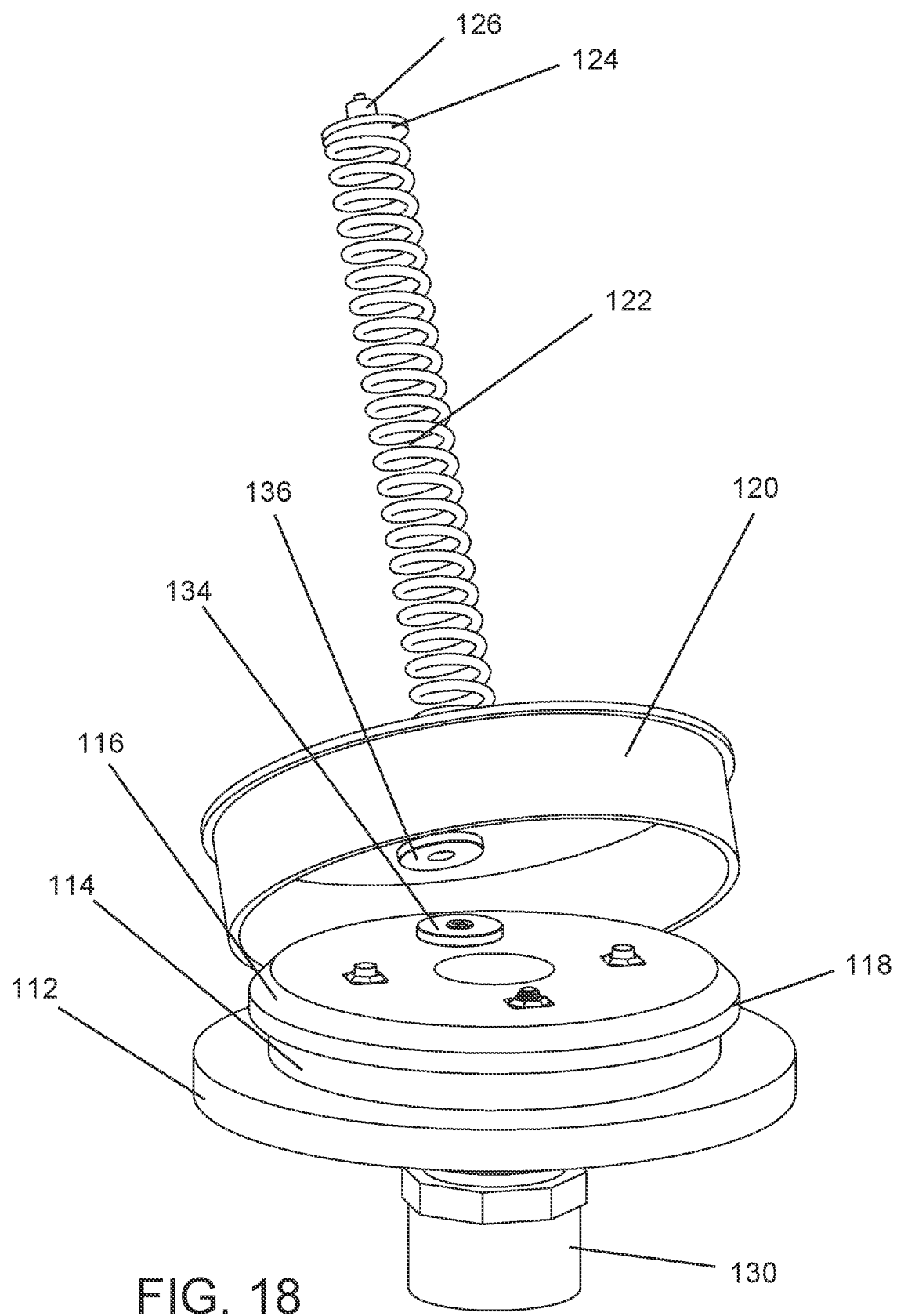
FIG. 18 is a perspective view of the breakaway base of the present invention shown having the breakaway tension spring tube removed and shown in a tilted position.
Figure 19:
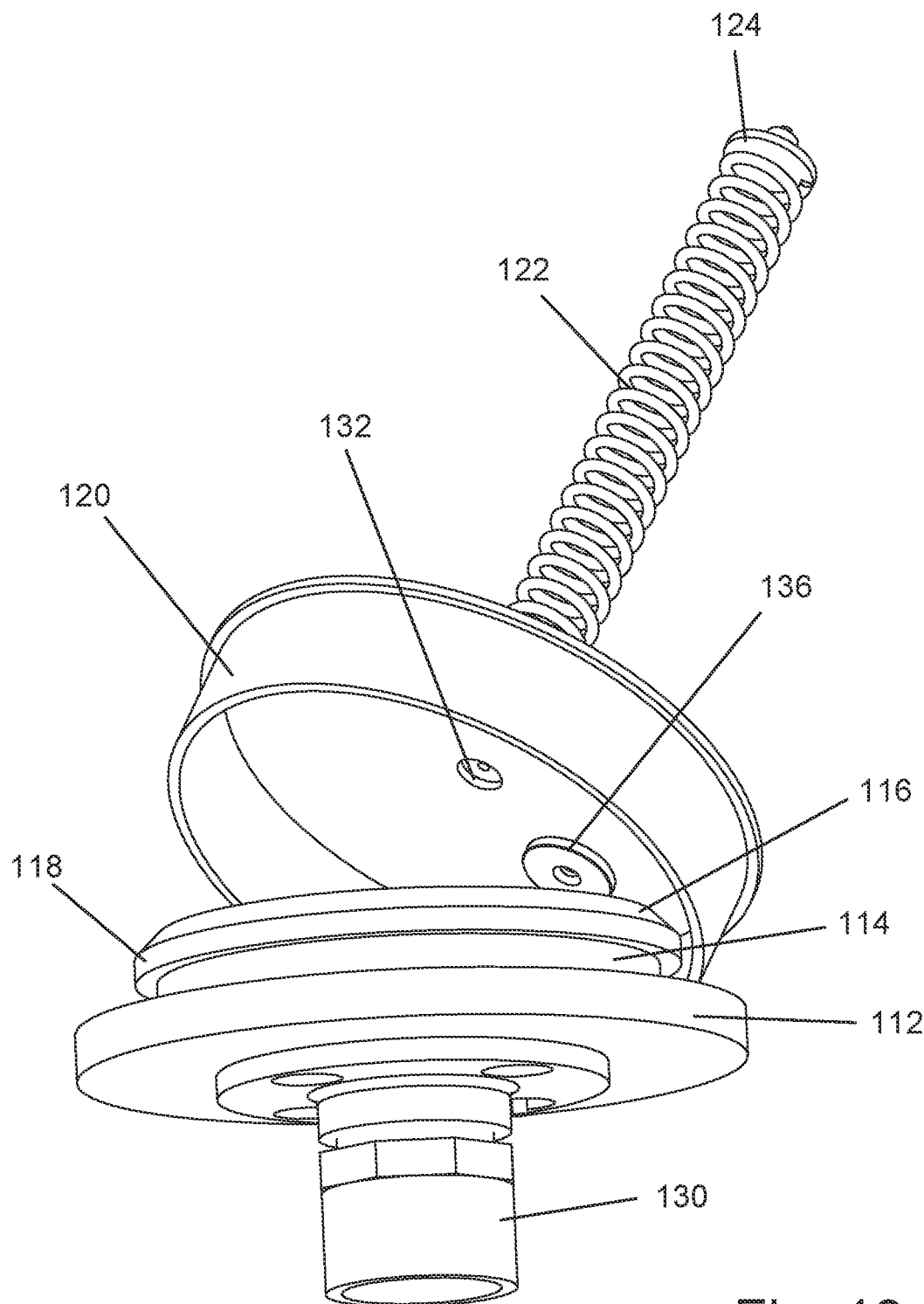
FIG. 19 is a perspective view of the breakaway base of the present invention shown having the breakaway tension spring tube removed and shown in a tilted position.
Figure 20:
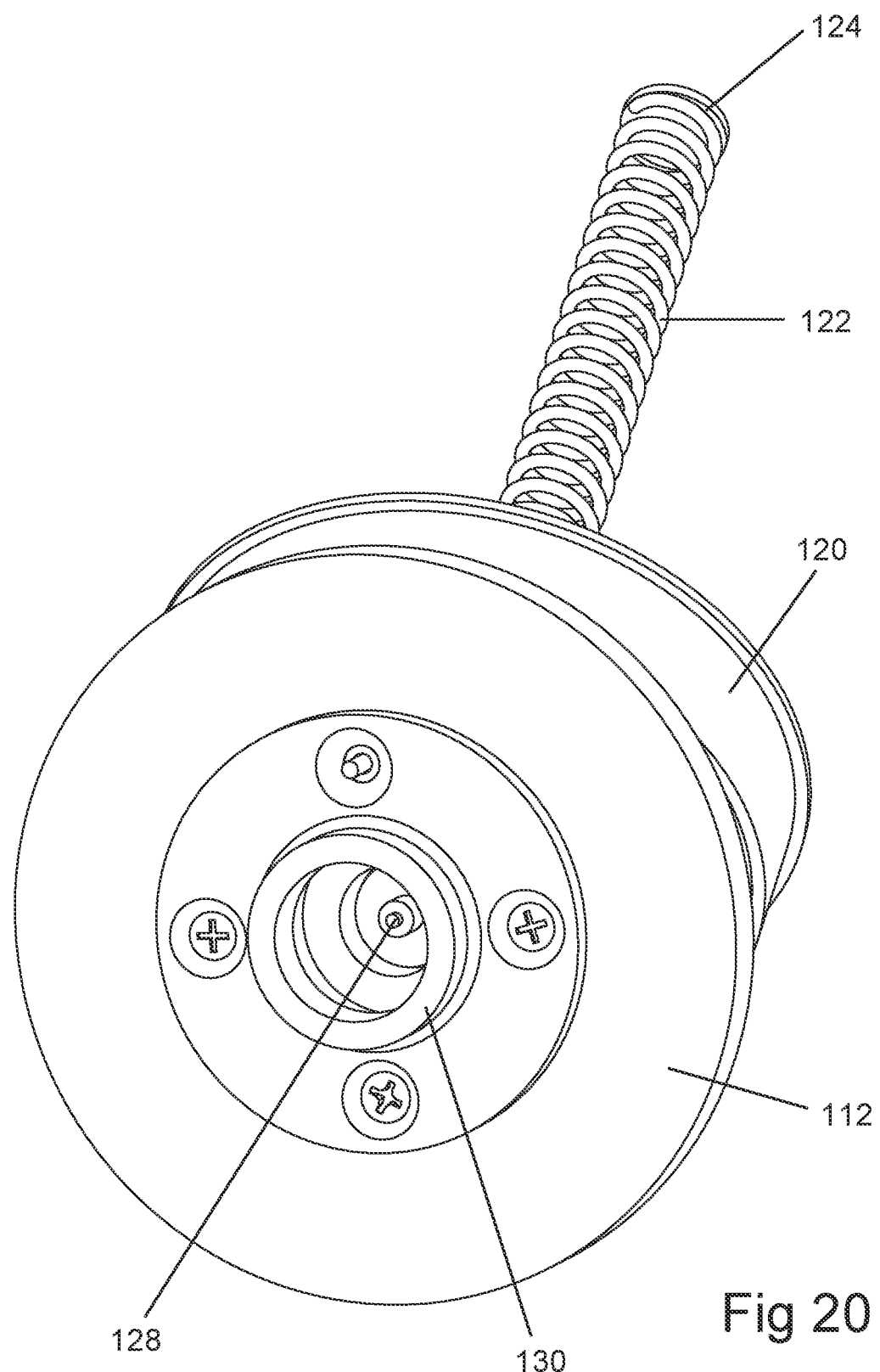
FIG. 20 is a bottom perspective view of the breakaway base of the present invention shown having the breakaway tension spring tube removed and shown in a tilted position.
Figure 21:
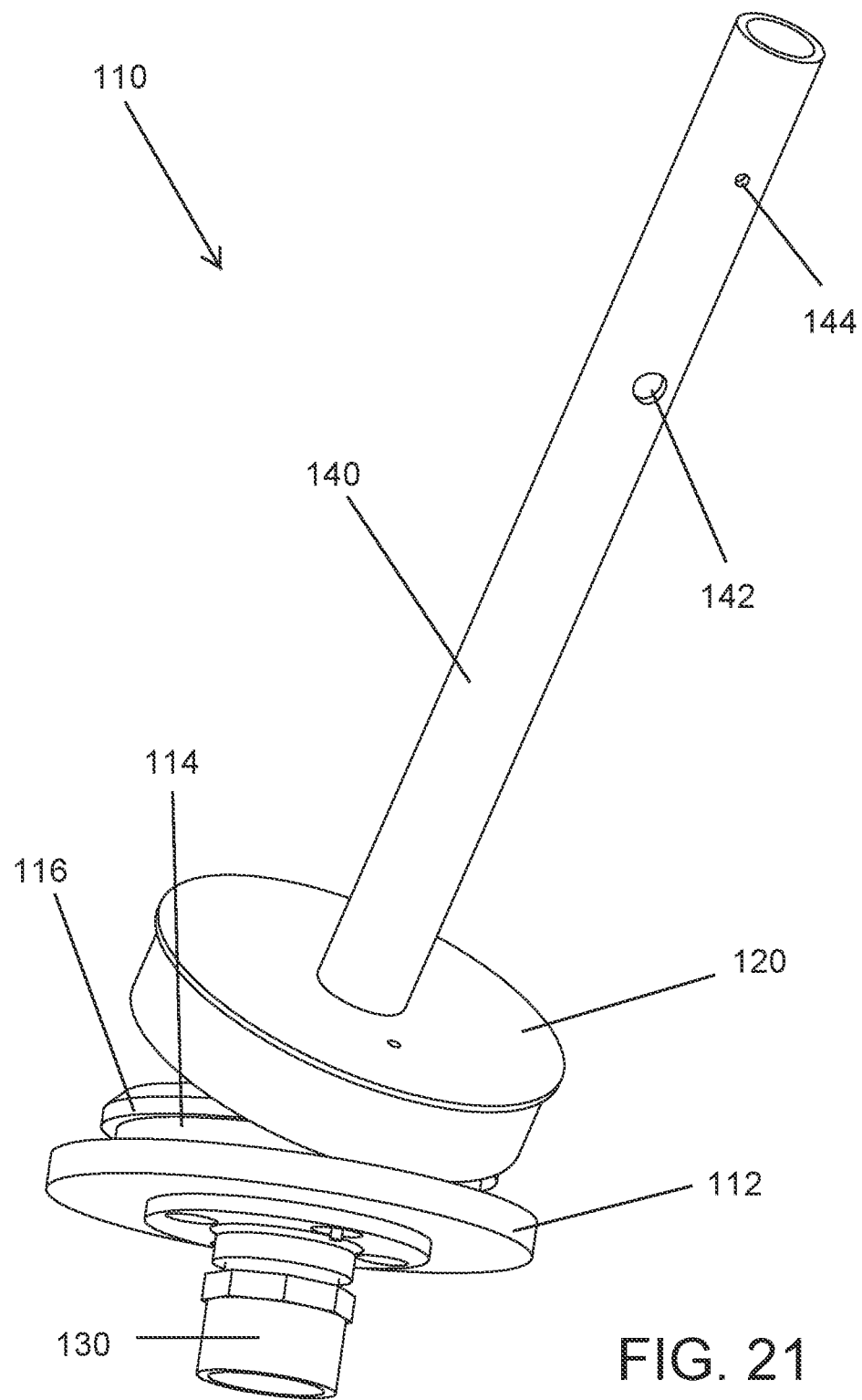
FIG. 21 is a perspective view of the breakaway base of the present invention shown in a tilted position.
Figure 22:
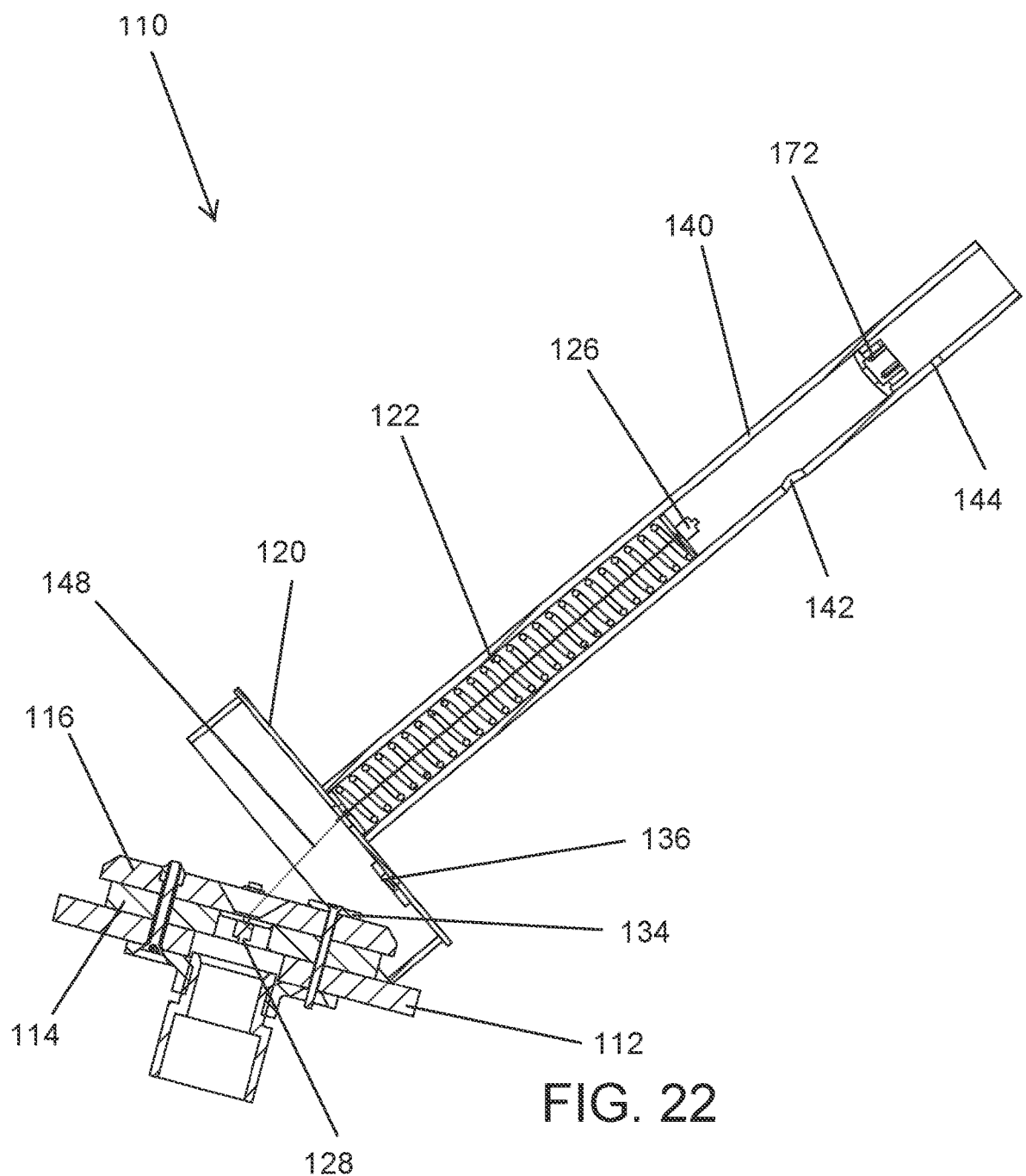
FIG. 22 is a partial section perspective view of the breakaway base of the present invention shown in a tilted position.
Figure 23:
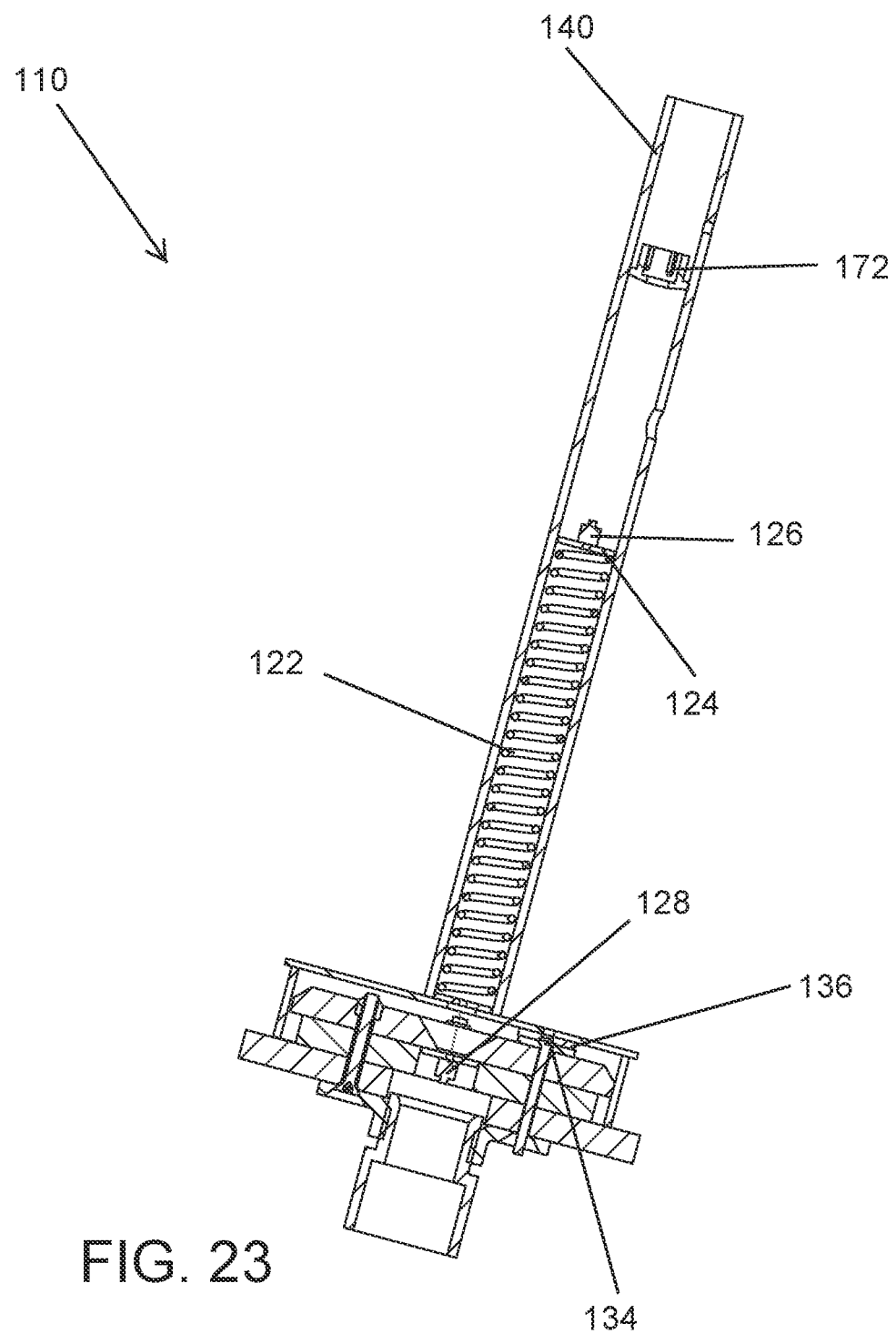
FIG. 23 is a partial section perspective view of the breakaway base of the present invention shown in an upright position.

With reference to FIGS. 7 and 8, the antenna assembly may fold or tilt from the upright position to more than 90 degrees from the upright position. In this manner the antenna may be pushed parallel with the ground allowing an implement to pass over the antenna. An advantage of the breakaway base 110 of the present invention is that the antenna may be pushed downward in any direction about the base pole 40 and a tension mechanism returns the antenna to an upright position. Those skilled in the art will appreciate that the antenna assembly may be removed from the field (for example, for storage during the off season), without requiring removal of the containment housing.

With reference to FIGS. 9-15, the antenna assembly 100 generally includes breakaway base 110, antenna pole assembly 150 having pole sections 154, 158, and 162, and active element or omni directional antenna 190. Depending upon the intended function of the remote data module 50, the antenna 190 may be of known suitable construction having the ability to transmit and/or receive signals representing data from the environment sensor 90. The top pole or antenna extension 154 includes a top pole cap 182. The top pole cap has a shoulder that slips down into the hollow interior of the pole and rim 184 engages the top of the top pole. The diameter of the shoulder may be sized such that the antenna pole cap 182 is press fit into the top pole 154. The cap 182 includes a bottom pocket 186 adapted for receiving a bulkhead jack or plug therein and the upper portion of the cap includes a cavity that is adapted for receiving the base 192 of the active element 190. The active element may include a tip 196 that forms a blunt end of the antenna active element. The tip 196 may further include a small LED light of known suitable construction to provide visibility of the antenna at night. Middle pole 158 and bottom extension or pole 162 include pole mating couplers 166. The coupler 166 includes a rim 168 that restricts the distance the coupler is inserted in to the pole extensions.

Those skilled in the art will appreciate that more or less extensions may be utilized depending upon the overall desired height of the antenna assembly 150. A hole 170 extends through the coupler 160 thereby allowing a bungee cord, coaxial cable or other elements to pass through the interior of the extension poles between the breakaway base and the active element 190. The lower end of the bottom antenna extension 162 includes a base coupler 172 that includes a rim 174 that defines the depth that the coupler extends into the pole. A hole extends through the coupler thereby defining a passageway into the pole. The lower end of the bottom pole 162 inserts into the breakaway pole spring tube 140. The spring tube includes an aperture 144 that may be used to lock the bottom extension 162 to the spring tube 140. A second aperture 142 extends through the spring tube 140 and is adapted for receiving a coaxial cable therethrough. The coaxial cable (not shown) may be routed from the remote data transmit module 50, through the cover 32, up and into the spring tube 140, through the hollow interior of extensions 154, 158, and 162, and electrical coupling with the active element 190. The coaxial cable or other suitable wire may have quick connects at both ends and a braided exterior to reduce rodent damage. Further, a bungee cord or other resilient member may be anchored to both ends of the antenna pole assembly 150 and routed through the interior of the extensions. In this manner, when the extensions are pulled apart the bungee cord stretches allowing the poles to be placed side by side but retaining the poles in close association. Further, in this manner, the bungie cord allows the poles to folded together but reduces the likelihood that the coaxial cable or other wire is pulled out of the poles or otherwise damaged.

With reference to FIGS. 16-23 the breakaway base 110 will be described in greater detail. The breakaway base 110 splits into an upper pole support portion and lower base support portion. The lower base support portion includes a base 112 having a cylindrical collar 114 extending above the base. A retention disc extends above the collar 114 and has a diameter larger than the diameter of the collar. The overlapping disc 116 forms a retention rim 118. A base pole coupling is fixed to the bottom of the base 112 and extends downward from the base. The base pole coupling 130 includes an inner diameter sized to receive and engage the outer diameter sidewall of the base pole 40. The upper pole support portion includes a pivot member 120 that has a cylindrical hollow interior having a diameter slightly larger than the diameter of the retention rim 118. When in the upright position the pivot member 120 rests on base 112 and surrounds the collar 114 and retention disc 116. A tension or compression spring 122 is positioned on a top portion of the pivot member 120. Washers 124 engage the ends of the springs. The tension or compression spring 122 is contained within the spring tube 140 which may be fixed or otherwise engaged to the top of the pivot member 120. Tension cable routing apertures 132 are formed through the center of the pivot member 120, base 112, collar 114 and retention disc 116. The retention cable 148 is routed through the center of the upper and lower portion, the washers 124 and the center of the spring 122. The lower end of retention cable 148 is fixed against the base 112 with a lower cable retention member or ferrule 128. Similarly, the upper end portion of the tension cable 148 is fixed against an upper washer 124 with an upper cable retention member of ferrule 126. The length of the tension cable is defined to apply a desired resting compression against the spring 122 when the breakaway base 110 is in an upright position. When a force is applied (directly or indirectly) against the spring tube 140, a lower edge of the pivot member slides on the base and engages against the collar. The retention rim 118 restricts the pivot member from sliding up and off the collar. Further, since the tension cable 148 has a defined length, when the spring tube 140 is tilted, a force translates against the spring, thereby compressing the spring. When the force against the tube 140 is removed the compression force of the spring forces the pivot member 120 back to the upright position. Retention magnet 134 is fixed to the base 112 and pivot magnet 136 is fixed to an underside of the pivot member 120. The two magnets 134 and 136 help align the pivot member 120 with the base 112 and restricts the antenna pole assembly 150 from rotating when in an upright position. The magnets further help define the minimal force required to tilt the pivot member 120. In this manner the magnets may be selected such that winds in excess of 20 mph do not apply a sufficient force to the antenna pole assembly 150 to cause the pivot member 120 to tilt.

Figure 24:
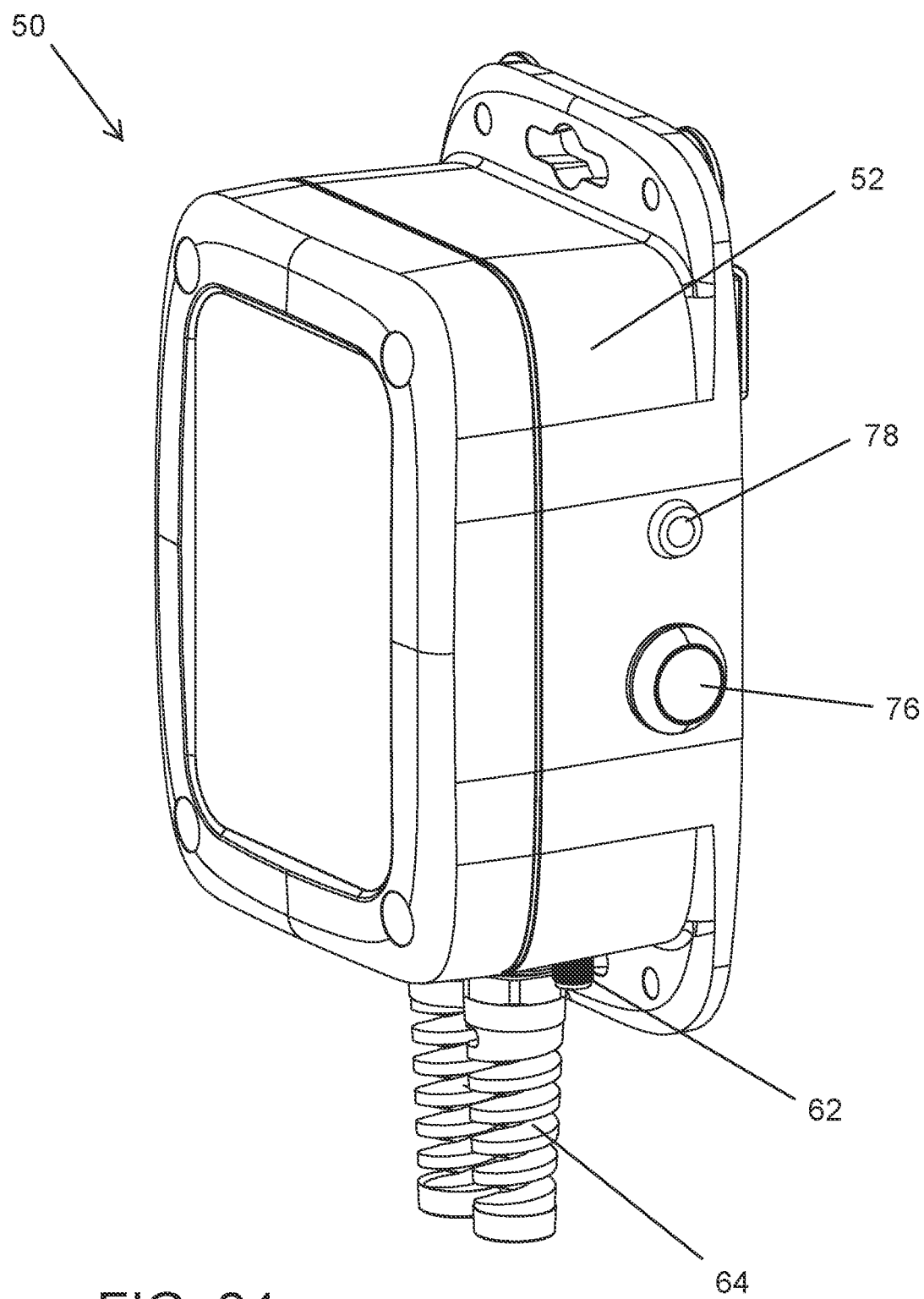
FIG. 24 is a perspective view of a remote data transmit module of the present invention.
Figure 25:
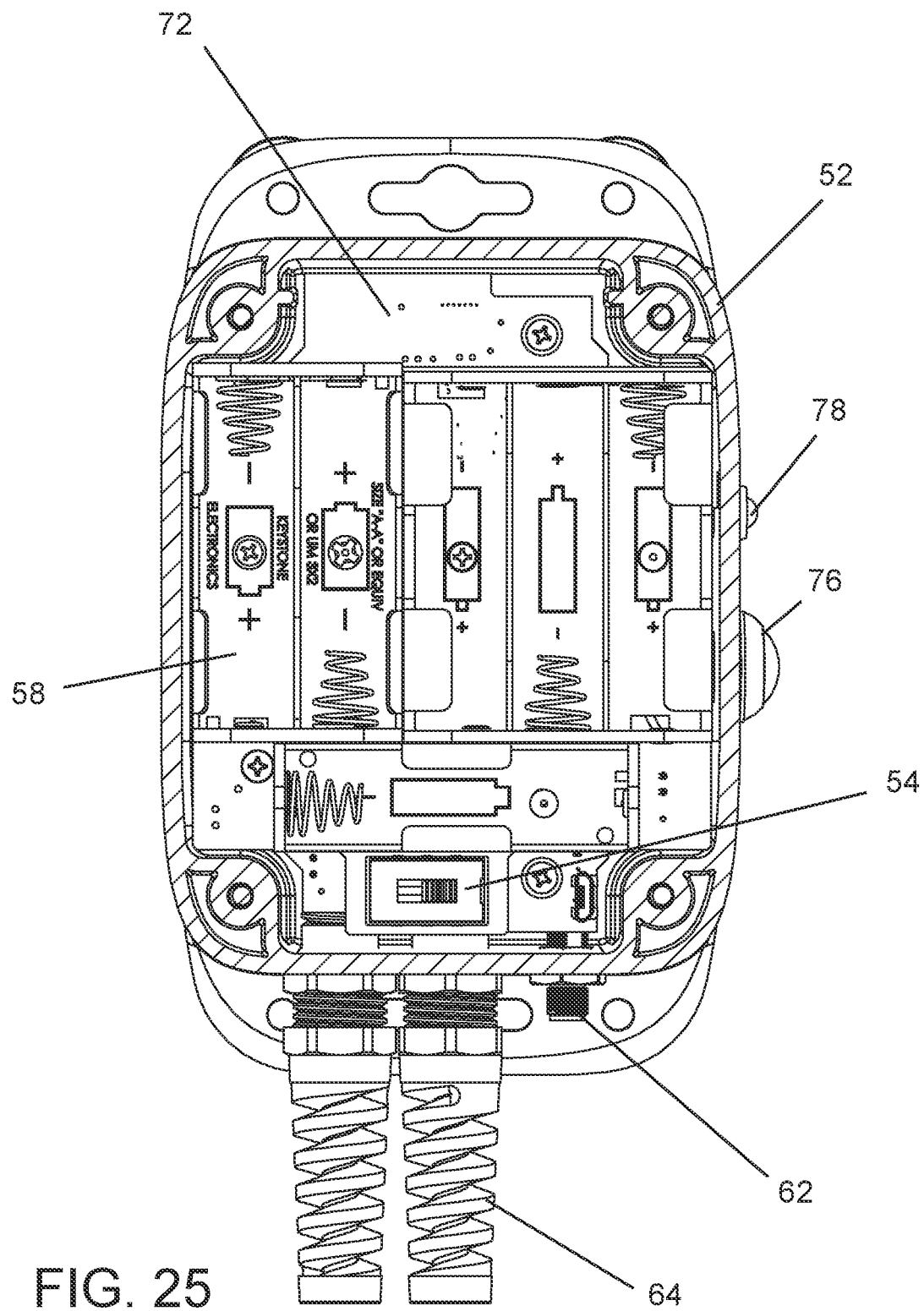
FIG. 25 is a partial sectioned perspective view of the remote data transmit module of the type shown in FIG. 24.

With reference to FIGS. 24 and 25 the remote data transmit module 50 includes a housing 52. The housing 52 includes a hermetic and water tight seal to the interior of the housing. An integrated circuit 72 and power supply 58 are contained within the housing. Outer push button switch 76, outer LED lit switch 78, coaxial cable out 62 and cable glands 64 for quick connection to hard wired sensors are all fixed to the housing and electrically coupled with the integrated circuit 72. An internal master switch 54 coupled to the circuit board controls the power supply to the integrated circuits and all components coupled to the circuit board 72. Components such as a transmit module or modem and a GPS transceiver are coupled to the circuit 72 within the housing 52 (not shown between the circuit board and the sidewalls of the housing).

By way of example and without limitation intended, one example of using the underground sensor mount and telemetry device 10 will be described in conjunction and reference to irrigating or spraying fertilizer on a field. One or more of the containment housings 20 of the underground sensor mount and telemetry device 10 are buried in desired locations in the field. The height of the antenna assembly 100 is selected dependent upon the particular crop being grown in the field. Further, the particular environment sensors or probes 90 contained within the housing 20 are determined by the grower. Once the underground sensor mount and telemetry devices 10 are positioned within the field, a wireless link may be established between the underground sensor mount and telemetry device 10 and a remote transceiver or base station. With a link established sensor data or information is transmitted from the field to allow real time monitoring of data from the sensors. Although the sensors are positioned below the crop canopy the breakaway antenna allows transmission of data regardless the height of the canopy. When an irrigation line or fertilizing implement arm passes the underground sensor mount and telemetry device 10, the breakaway antenna assembly 100 folds down rather than breaking off. When the implement is past, the antenna assembly springs back into an upright position. In this manner, the filed may be worked without the necessity to remove the antennas from the field. A landscape filtration fabric may be wrapped about the outside of the containment housing 20 to reduce the amount of silt seeping into the housing. The probes 92 of the environment sensor may pierce the fabric and insert into the surrounding soil. Additionally, a lower cover or ring may be engaged to the containment housing to increase the lower surface area of the housing and restrict the edge of the housing from being pressed downward into the soil. In this manner, a force to the top of the housing (such as a tractor or other equipment rolling on the soil above the containment housing) won't tend to shift the housing downward.

These and various other aspects and features of the invention are described with the intent to be illustrative, and not restrictive. This invention has been described herein with detail in order to comply with the patent statutes and to provide those skilled in the art with information needed to apply the novel principles and to construct and use such specialized components as are required. It is to be understood, however, that the invention can be carried out by specifically different constructions, and that various modifications, both as to the construction and operating procedures, can be accomplished without departing from the scope of the invention. Further, in the appended claims, the transitional terms comprising and including are used in the open-ended sense in that elements in addition to those enumerated may also be present. Other examples will be apparent to those of skill in the art upon reviewing this document.

The following claims are incorporated into this description.

The invention claimed is:

1. An apparatus for transmitting signals from a remote data transmit module that is coupled to environment sensors, the apparatus comprising:
   an antenna assembly having a breakaway base adapted for receiving pole sections capable of coupling to both the breakaway base and an active element for transmitting and receiving signals; and
   the breakaway base including
   a pole support portion and a base support portion, wherein the pole support portion is coupled to the base support portion and wherein the pole support portion hinges about an upper surface of the base support portion in any angle of 360 degrees from a center of the upper surface of the base support portion.

2. The apparatus as recited in claim 1, wherein the base support portion includes a lower base having a cylindrical collar extending above the lower base, the base support portion further having a retention disc extending above the collar, wherein the retention disc has a diameter larger than the diameter of the collar such that the retention disc overlaps the cylindrical collar and forms a retention rim.

3. The apparatus as recited in claim 2, further including a base pole coupling fixed to a bottom of the lower base, wherein the base pole coupling extends downward from the lower base.

4. The apparatus as recited in claim 3, wherein the base pole coupling includes an inner diameter adapted to receive and engage an outer diameter sidewall of an anchoring base pole.

5. The apparatus as recited in claim 1, wherein the pole support portion includes a pivot member that has a cylindrical hollow interior having a diameter slightly larger than a diameter of the retention rim.

6. The apparatus as recited in claim 5, wherein when the apparatus is in an upright position the pivot member rests on the lower base and surrounds the collar and retention disc.

7. The apparatus as recited in claim 6, further including a compression spring coupled to a top portion of the pivot member.

8. The apparatus as recited in claim 7, wherein the compression spring is contained within a spring tube engaged to a top of the pivot member.

9. The apparatus as recited in claim 8, further including tension cable routing apertures formed through centers of the pivot member, lower base, collar and retention disc.

10. The apparatus as recited in claim 9, further including a retention cable extending through the routing apertures and having one end fixed to the lower base and an opposing end fixed to a free end of the compression spring.

11. The apparatus as recited in claim 10, wherein a length of the retention cable is defined to apply a desired resting compression against the compression spring when the breakaway base is in an upright position.

12. The apparatus as recited in claim 11, further including retention magnets fixed to the lower base and including pivot magnets fixed to an underside of the pivot member wherein the retention magnets and pivot magnets attract to each other to align the pivot member with the lower base and restrict the apparatus from rotating when in an upright position.

13. The apparatus as recited in claim 6, further including a tension member coupled to both the pole support portion and the base support portion of the breakaway base.

14. An apparatus for transmitting signals from a remote data transmit module that is coupled to environment sensors, the apparatus comprising:

an antenna assembly having a breakaway base adapted for receiving pole sections capable of coupling to both the breakaway base and an active element for transmitting and receiving signals;

the breakaway base including a base support portion and a pole support portion;

the base support portion including a lower base having a cylindrical collar extending above the lower base, the base support portion further having a retention disc extending above the collar, wherein the retention disc has a diameter larger than the diameter of the collar such that the retention disc overlaps the cylindrical collar and forms a retention rim; and the pole support portion having a pivot member that has a cylindrical hollow interior having a diameter slightly larger than a diameter of the retention rim, wherein when the apparatus is in an upright position the pivot member rests on the lower base and surrounds the collar and retention disc.

15. The apparatus as recited in claim 14, further including a base pole coupling fixed to a bottom of the lower base, wherein the base pole coupling extends downward from the lower base.

16. The apparatus as recited in claim 15, wherein the base pole coupling includes an inner diameter adapted to receive and engage an outer diameter sidewall of an anchoring base pole.

17. The apparatus as recited in claim 16, further including a tension member coupled to both the pole support portion and the base support portion of the breakaway base.

18. The apparatus as recited in claim 14, further including retention magnets fixed to the lower base and including pivot magnets fixed to an underside of the pivot member wherein the retention magnets and pivot magnets attract to each other to align the pivot member with the lower base and restrict the apparatus from rotating when in an upright position.

* * * * *